(12) United States Patent
Higuchi

(10) Patent No.: US 6,882,588 B2
(45) Date of Patent: Apr. 19, 2005

(54) MEMORY MACRO WITH MODULAR PERIPHERAL CIRCUIT ELEMENTS HAVING A NUMBER OF LINE DRIVERS SELECTABLE BASED ON NUMBER OF MEMORY BLOCKS

(75) Inventor: Tsutomu Higuchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/388,445

(22) Filed: Mar. 17, 2003

(65) Prior Publication Data

US 2003/0174564 A1 Sep. 18, 2003

Related U.S. Application Data

(62) Division of application No. 09/691,096, filed on Oct. 19, 2000, now Pat. No. 6,567,328.

(30) Foreign Application Priority Data

Dec. 22, 1999 (JP) .......................................... 11-364210

(51) Int. Cl.⁷ ................................................ G11C 7/00
(52) U.S. Cl. ............... 365/205; 365/230.6; 365/189.05; 365/230.03
(58) Field of Search ........................... 365/205, 230.06, 365/189.05, 230.03

(56) References Cited

U.S. PATENT DOCUMENTS

| 4,143,178 A | 3/1979 | Harada et al. |
| 5,027,324 A | 6/1991 | Seo |
| 5,506,816 A * | 4/1996 | Hirose et al. .......... 365/230.06 |
| 5,526,307 A * | 6/1996 | Yiu et al. .............. 365/158.01 |
| 6,046,478 A | 4/2000 | Klein |
| 6,069,828 A | 5/2000 | Kaneko et al. |
| 6,147,925 A * | 11/2000 | Tomishima et al. ..... 365/230.03 |
| 6,157,588 A * | 12/2000 | Matsumoto et al. ........ 365/214 |
| 6,195,302 B1 | 2/2001 | Hardee |
| 6,246,614 B1 * | 6/2001 | Ooishi ........................ 365/191 |
| 6,248,658 B1 | 6/2001 | Buynoski |
| 6,249,475 B1 | 6/2001 | Atwell et al. |
| 6,400,637 B1 * | 6/2002 | Akamatsu et al. ..... 365/230.06 |

FOREIGN PATENT DOCUMENTS

JP 11354739 12/1999

\* cited by examiner

*Primary Examiner*—Connie C. Yoha
(74) *Attorney, Agent, or Firm*—Volentine Francos & Whitt, PLLC

(57) ABSTRACT

A memory macro includes a variable number of memory cell arrays and associated circuits, and peripheral circuit elements such as line drivers, power-source transistors, and power-source capacitors coupled to the associated circuits. Multiple peripheral circuit elements of one type are placed side by side in a certain direction, aligned in that direction with one or more memory cell arrays, and are coupled in parallel to the associated circuits of those memory cell arrays. The number of these peripheral circuit elements is selected according to the number of memory cell arrays aligned with them, so that electrical requirements can be met without unnecessary consumption of space or current.

10 Claims, 27 Drawing Sheets

GEN4

MEMORY MACRO WITH MODULAR PERIPHERAL CIRCUIT ELEMENTS HAVING A NUMBER OF LINE DRIVERS SELECTABLE BASED ON NUMBER OF MEMORY BLOCKS

This is a divisional application of application Ser. No. 09/691,096, now U.S. Pat. No. 6,567,328, filed Oct. 19, 2000, which is hereby incorporated by reference in its entirety for all purposes.

BACKGROUND OF THE INVENTION

The present invention relates to the modularization of a semiconductor memory embedded as a macrocell in a semiconductor device.

Large-scale integrated (LSI) circuits are often designed by combining standardized units referred to as cells, macrocells, macros, or cores. In recent years, it has become possible to combine dynamic random-access memory macrocells, referred to below as DRAM macros, with processor cores and other data-processing logic circuits on a single semiconductor chip, to create devices that can process large quantities of data without the need for external memory.

A DRAM macro includes one or more arrays of memory cells, together with peripheral circuits such as sense amplifiers, decoders, line drivers, and internal power sources. All of these components are pre-designed as standard modules and stored in a database or library. The circuit designer creates a DRAM macro with a desired memory capacity by combining the necessary number of standard modules, using the stored designs. The design process can be automated by the use of a hardware description language.

A consequence of this design process is that certain standard peripheral modules have to supply the needs of varying numbers of memory cell array modules, depending on the overall size of the DRAM macro. Peripheral modules of this type include word line drivers for main word lines, power-source modules that supply power to sense amplifiers, column drivers that select the sense amplifiers, and charge pumps that generate voltages higher than the power-supply voltage. Since they must be capable of functioning in DRAM macro configurations with the maximum memory capacity, these standard modules are large in size, and are unnecessarily large when used in smaller DRAM macro configurations. Resulting problems include wasted layout space and unnecessary power consumption.

These problems are not unique to DRAM macros, but occur in other types of memory macros as well.

Further information about these problems will be given in the detailed description of the invention. This application also claims priority of Japanese Patent Application No. H11-364210, the disclosure of which is hereby included by reference.

SUMMARY OF THE INVENTION

An object of the present invention is to save space in a memory macro.

Another object of the invention is to reduce power consumption in a memory macro.

The invention pertains to a memory macro having a first number of memory cell arrays aligned in a first direction, with associated circuits disposed adjacent the memory cell arrays. The first number varies according to the memory capacity of the memory macro. The invented method of fabricating this memory macro includes the following steps:

(a) selecting a second number according to the first number;

(b) placing the second number of peripheral circuit elements side by side in the first direction, aligned with the memory cell arrays in the first direction; and (c) electrically interconnecting the peripheral circuit elements, in parallel, to the associated circuits.

The invention provides memory macros, fabricated in this way, in which the associated circuits are sub-word line drivers and the peripheral circuit elements are capacitors; in which the associated circuits are sub-word line drivers and the peripheral circuit elements are unit main word line drivers; in which the associated circuits are sense amplifier arrays and the peripheral circuit elements are transistors supplying power to the sense amplifier arrays; and in which the associated circuits are sense amplifier arrays and the peripheral circuit elements are column line drivers.

The peripheral circuit elements drive the associated circuits, or supply power to the associated circuits. The required amount of power or driving capability depends on the number of memory cell arrays (the first number). The invention saves space and prevents unnecessary power consumption by enabling the second number to chosen so that the requirement is met without being over-fulfilled.

DETAILED DESCRIPTION OF THE INVENTION

Figure 1:
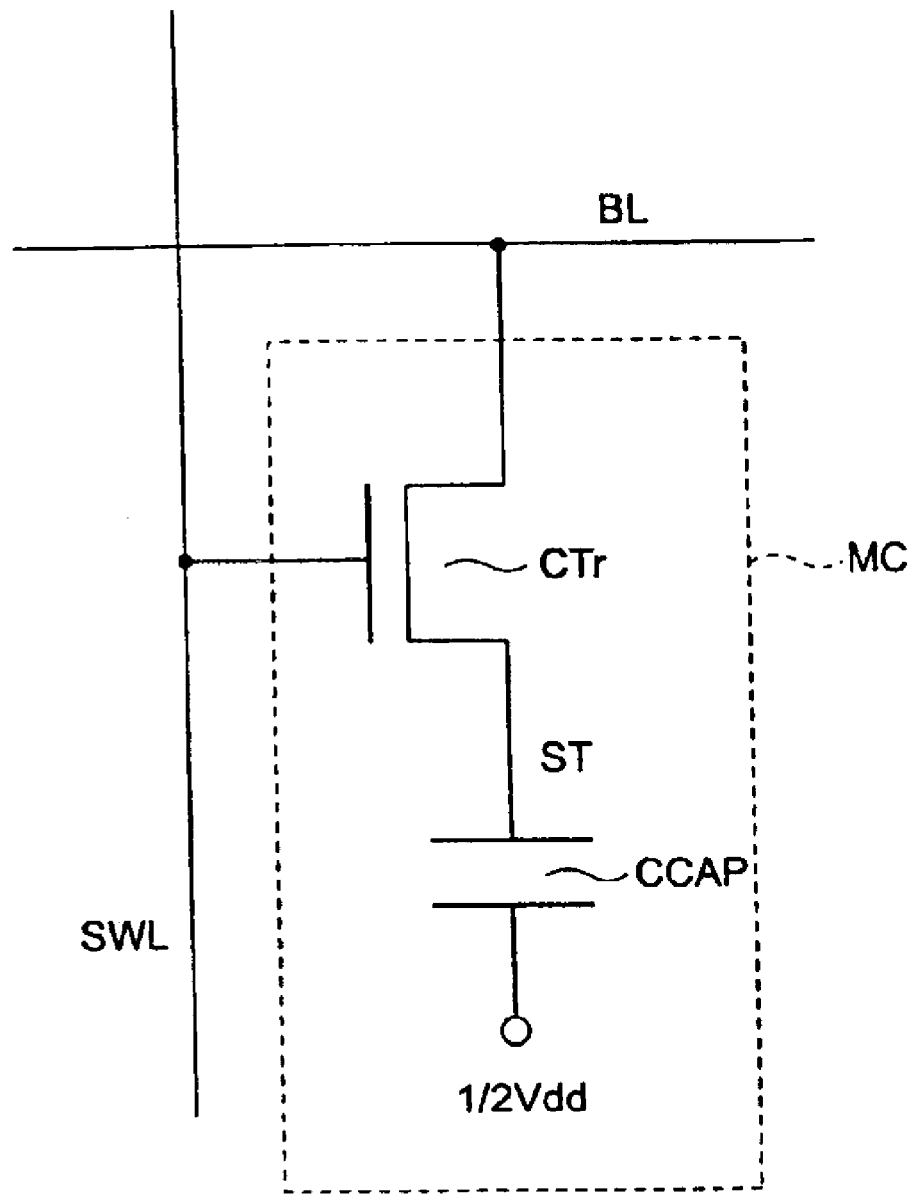
FIG. 1 is a circuit diagram of a memory cell.

Memory macros embodying the present invention will be described with reference to the attached drawings, following a more detailed description of a conventional memory macro. In the drawings, the same reference characters will be used to designate similar elements in both the conventional and invented memory macros.

All memory macros described below operate on a supply voltage that will be denoted Vdd. The ground potential will be denoted Vss, and will also be indicated by the conventional ground symbol in the drawings. The lower-case letter 'b' will be used to indicate negative logic or complementary signals or signal lines. For example, signal SLPGb has negative logic (is active low), and bit lines BL1 and BLb1 are complementary.

Referring to FIG. 1, the memory macros described below employ a memory cell MC comprising a cell transistor CTr and a cell capacitor CCAP. The cell transistor CTr is an n-channel metal-oxide-semiconductor (NMOS) transistor having a drain electrode coupled to a bit line BL, a gate electrode coupled to a sub-word line SWL, and a source electrode coupled through a source node ST to one plate of the cell capacitor CCAP. The other plate of the cell capacitor CCAP is coupled to a node that is held at one-half the supply voltage potential (½ Vdd).

When this memory cell MC stores '1' data, the cell capacitor CCAP is charged so that the source node ST is at the power-supply potential Vdd. To turn on the cell transistor CTr and read this potential (Vdd) out onto the bit line BL, the gate potential of the cell transistor CTr must exceed Vdd by at least the NMOS transistor threshold voltage Vtn. The sub-word line SWL must therefore be boosted to a potential Vdd+Vtn+α, where α is a positive voltage margin with respect to Vtn. This boosted word-line potential (Vdd+Vtn+α) will be denoted Vpp below. The desired value of Vpp is intermediate between Vdd and twice Vdd.

A detailed description will now be given of a conventional DRAM macro that can be configured to provide different memory capacities, to suit the needs of different semiconductor devices. This description is relevant because the invented memory macro has a similar configuration.

Figure 2:
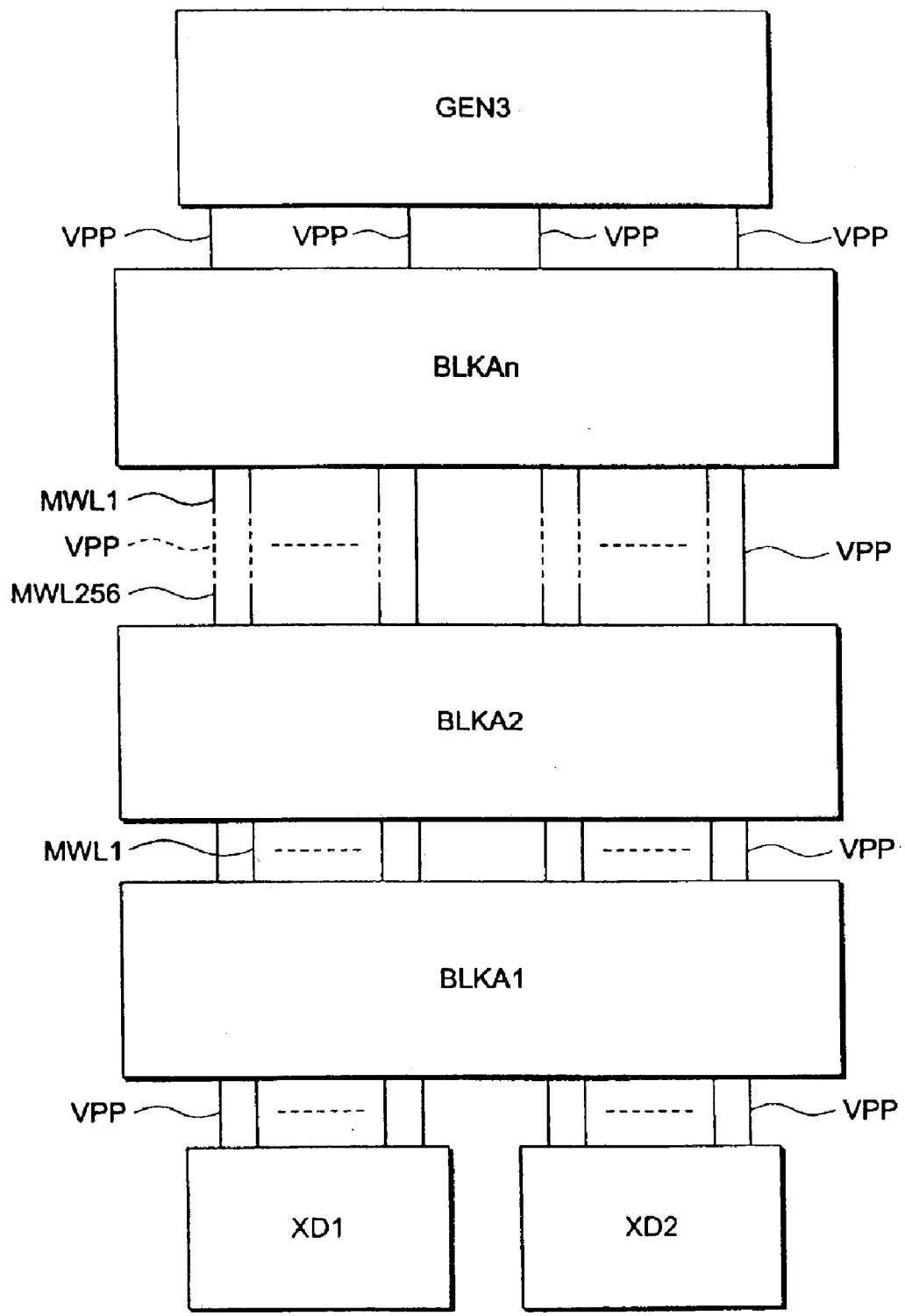
FIG. 2 is a block diagram of a conventional DRAM macro.

Referring to FIG. 2, the conventional DRAM macro comprises a word-line voltage boosting circuit GEN3, a selectable number (n) of memory blocks BLKA1 to BLKAn, and a selectable number of x-decoder blocks. In the example shown, there are two x-decoder blocks XD1, XD2. The memory capacity can be varied by varying the number of x-decoder blocks, and the number and size of the memory blocks.

The word-line voltage boosting circuit GEN3 supplies the boosted word-line potential Vpp to the memory blocks and x-decoder blocks through supply lines denoted VPP. Each x-decoder block XD1, XD2 is linked to the memory blocks BLKA1 to BLKAn by two hundred fifty-six main word lines denoted MWL1 to MWL256.

Figure 3:
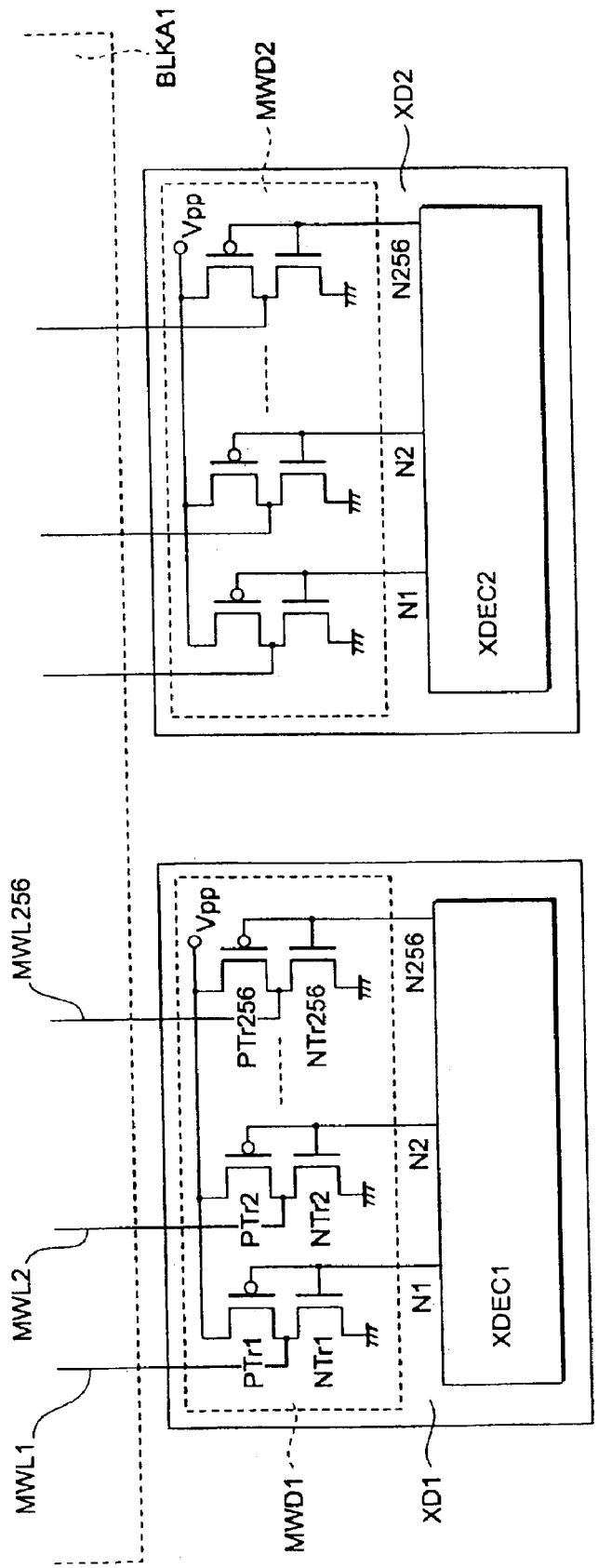
FIG. 3 is a circuit diagram of the x-decoder blocks in FIG. 2.

Referring to FIG. 3, the x-decoder blocks XD1, XD2 comprise respective main word line drivers MWD1, MWD2 and x-decoders XDEC1, XDEC2. In the first main word line driver MWD1, the first main word line MWL1 is coupled to the drain electrodes of a p-channel metal-oxide-semiconductor (PMOS) transistor PTr1 and an NMOS transistor NTr1. The source electrode of PMOS transistor PTr1 is coupled to the VPP supply line and receives the boosted word-line voltage Vpp. The source electrode of NMOS transistor NTr1 is coupled to a ground node and receives the ground potential Vss. The gate electrodes of both transistors PTr1, NTr1 are coupled to an output node N1 of x-decoder XDEC1. These two transistors PTr1, NTr1 accordingly function as an inverter, driving main word line MWL1 high (Vpp) when node N1 is low (Vss), and low when node N1 is high. Each word-line driver MWD1, MWD2 comprises an array of two hundred fifty-six such inverters, driving respective main word lines by inverting the levels of respective nodes N1 to N256.

The x-decoders XDEC1, XDEC2 decode external address signals (not visible) that select one of the main word lines. When a main word line is selected, the corresponding one of nodes N1 to N256 is raised to the Vpp level. Nodes corresponding to non-selected main word lines are left at the Vss level.

Figure 4:
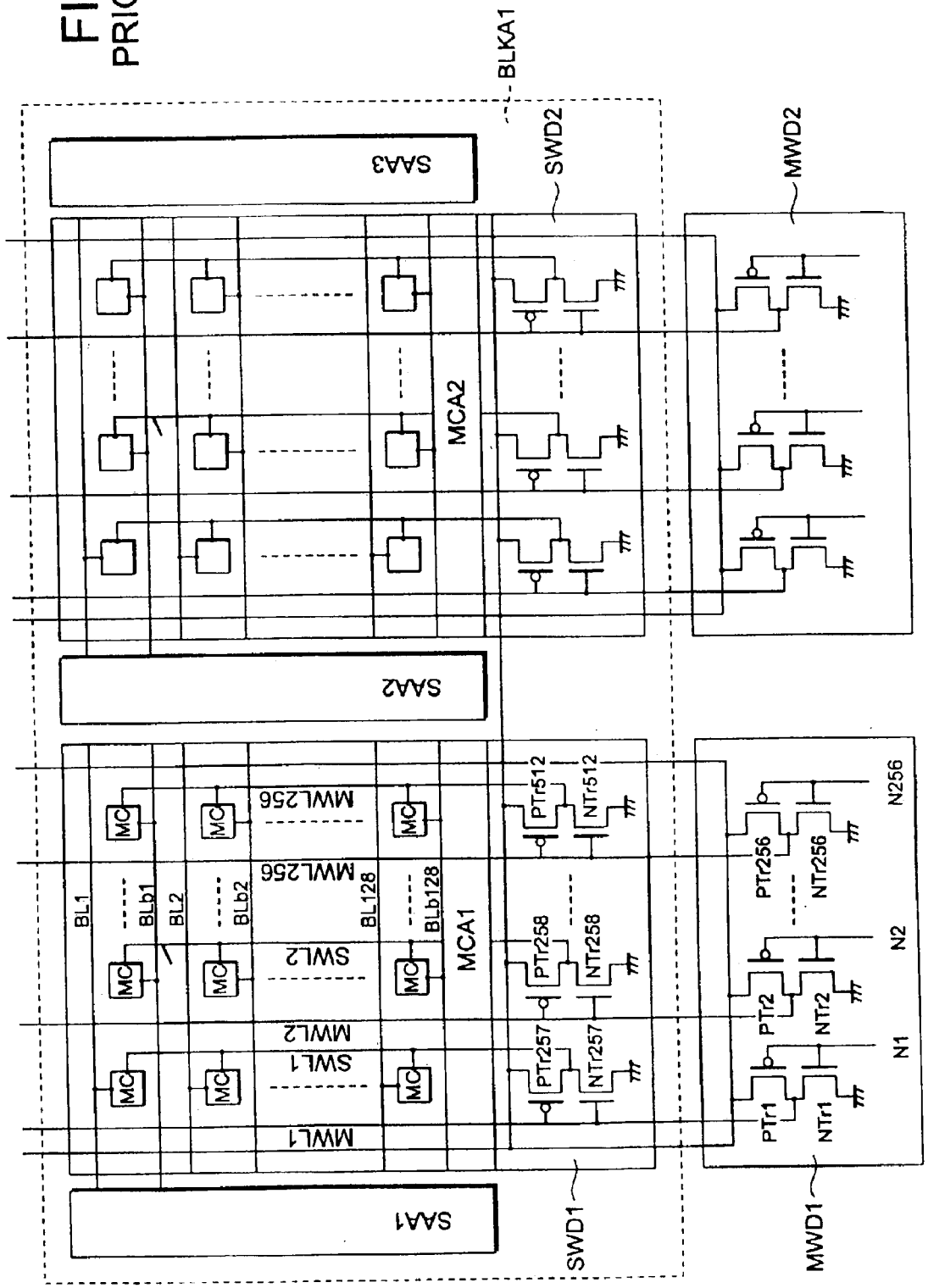
FIG. 4 is a circuit diagram of a memory block in FIG. 2.

Referring to FIG. 4, each memory block comprises at least one memory cell array, at least one sub-word line driver, and a plurality of sense amplifier arrays. In the example shown, there are two memory cell arrays MCA1, MCA2, two sub-word line drivers SWD1, SWD2, and three sense amplifier arrays SAA1, SAA2, SAA3.

Each sub-word line driver SWD1, SWD2 comprises an array of inverters similar to the inverters in the main word line drivers. To distinguish the transistors in the main word line drivers from the transistors in the sub-word line drivers, the former are denoted PTr1 to PTr256 and NTr1 to NTr256 in FIG. 3, while the latter are denoted PTr257 to PTr512 and NTr257 to NTr512 in FIG. 4. The source electrodes of transistors PTr257 to PTr512 are coupled to the VPP supply line and receive the boosted Vpp potential, while the source electrodes of transistors NTr257 to NTr512 are coupled to ground (Vss). The gate electrodes of these transistors PTr257 to PTr512 and NTr257 to NTr512 are coupled to respective main word lines, and their drain electrodes are coupled to respective sub-word lines SWL1 to SWL256. Thus the sub-word line drivers SWD1, SWD2 drive the sub-word lines SWL1 to SWL256 by inverting the levels of the main word lines MWL1 to MWL256.

Each memory cell array MCA1, MCA2 comprises a plurality of memory cells MC coupled in a matrix array to the sub-word lines SWL1 to SWL256 and to bit lines BL1 to BL128 and BLb1 to BLb128. The even-numbered bit lines are coupled to the even-numbered sense amplifier array SAA2; the odd-numbered bit lines are coupled to the odd-numbered sense amplifier arrays SAA1, SAA3.

Each sense amplifier array SAA1, SAA2, SAA3 comprises a plurality of differential amplifiers that amplify the potential differences on respective pairs of complementary bit lines. Details will be shown later.

The combined operation of the main word line drivers and sub-word line drivers can be explained as follows. When no main word line is selected, all nodes N1 to N256 are at the Vss level, so the inverters in the main word line drivers MWD1, MWD2 drive all main word lines to the Vpp level. The inverters in the sub-word line drivers SWD1, SWD2 then drive all sub-word lines to the Vss level. The cell transistors CTr in all memory cells MC are thereby turned off, and the data stored in the memory cells are retained without being read out onto the bit lines.

When, for example, the first main word line MWL1 is selected, x-decoder XDEC1 drives node N1 to the Vpp level and leaves nodes N2 to N256 at the Vss level. The inverters in the main word line drivers and sub-word line drivers then drive the first main word line MWL1 to the Vss level, and drive the first sub-word line SWL1 to the Vpp level in each memory block BLKA1 to BLKAn. In the memory cells MC coupled to these sub-word lines SWL1 in each memory block BLKA1 to BLKAn, the cell transistor CTr switches on. The data stored in the cell capacitors are thereby read out onto the bit lines and amplified by the sense amplifier arrays SAA1, SAA2.

Figure 5:
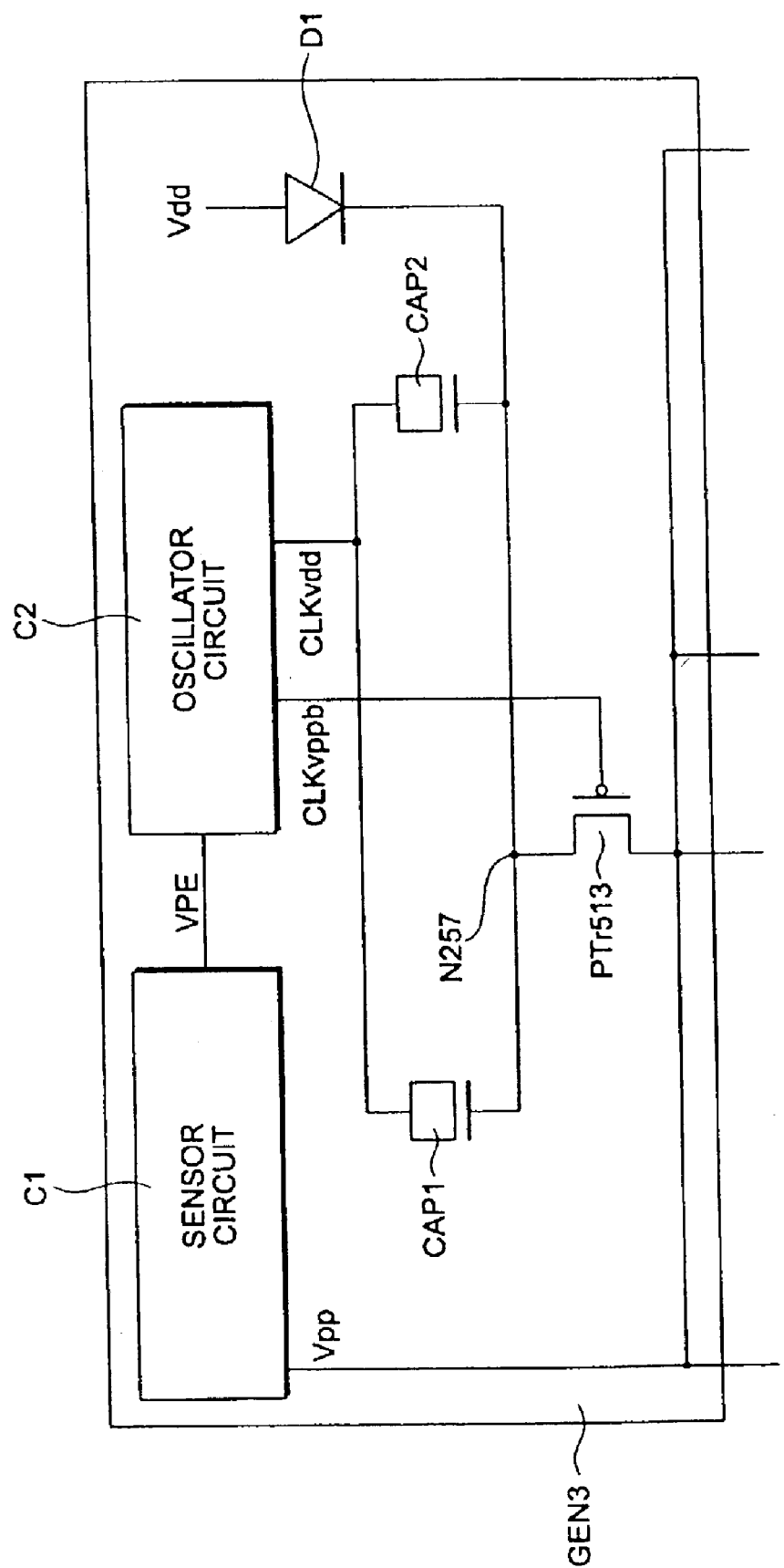
FIG. 5 is a circuit diagram of the boosted word line voltage generator in FIG. 2.

Referring to FIG. 5, the word-line voltage boosting circuit GEN3 comprises a sensor circuit C1, an oscillator circuit C2, a pair of NMOS capacitors CAP1, CAP2, a diode D1, and a PMOS transistor PTr513. Sensor C1 detects the boosted word-line voltage Vpp on the VPP supply line, and thereby generates an enable signal VPE. The oscillator circuit C2 receives the enable signal VPE, and generates a pair of complementary clock signals CLKvdd and CLKvppb. Capacitors CAP1, CAP2 are connected in parallel between the CLKvdd output terminal of the oscillator circuit C2 and a node N257, which node is also connected to the drain electrode of PMOS transistor PTr513 and the cathode electrode of diode D1. The anode of diode D1 is coupled to the power supply (Vdd). The gate electrode of PMOS transistor PTr513 receives the complementary clock signal CLKvppb. The source electrode of PMOS transistor PTr513 is connected to the VPP supply line.

When the sensor circuit C1 detects that the VPP supply line is below the desired Vpp potential (Vdd+Vtn+α), the VPE signal is driven high, enabling the oscillator circuit C2. Clock signal CLKvdd then alternates between the Vdd and Vss potentials, while clock signal CLKvppb alternates in a complementary manner between Vss and Vpp, causing the word-line voltage boosting circuit GEN3 to operate as a charge pump. In the state with CLKvdd low, CLKvppb high, and PMOS transistor PTr513 switched off, capacitors CAP1 and CAP2 charge through diode D1, bringing node N257 to the Vdd potential level. When CLKvdd goes high, node N257 is boosted by capacitive coupling to twice the Vdd potential level. Since CLKvppb simultaneously goes low, PTr513 turns on, conducting positive charge onto the VPP supply line, thereby raising the Vpp potential. When CLKvdd goes low again and CLKvppb goes high (Vpp), transistor PTr513 is switched off, so the charge cannot return to node N257 and the VPP supply line remains at its raised potential. Repetitions of this operation pump the VPP supply line up to the desired potential level.

When Vpp exceeds the desired potential level, the sensor circuit C1 drives the VPE signal low to disable the oscillator circuit C2 and halt the voltage pumping operation. Clock signal CLKvdd is now held at the Vss level, and the complementary clock signal CLKvppb is held at the Vpp level, keeping transistor PTr513 in the off state. This state is maintained until current consumption in the word line drivers causes the VPP supply line to fall below the desired Vpp potential again.

Figure 6:
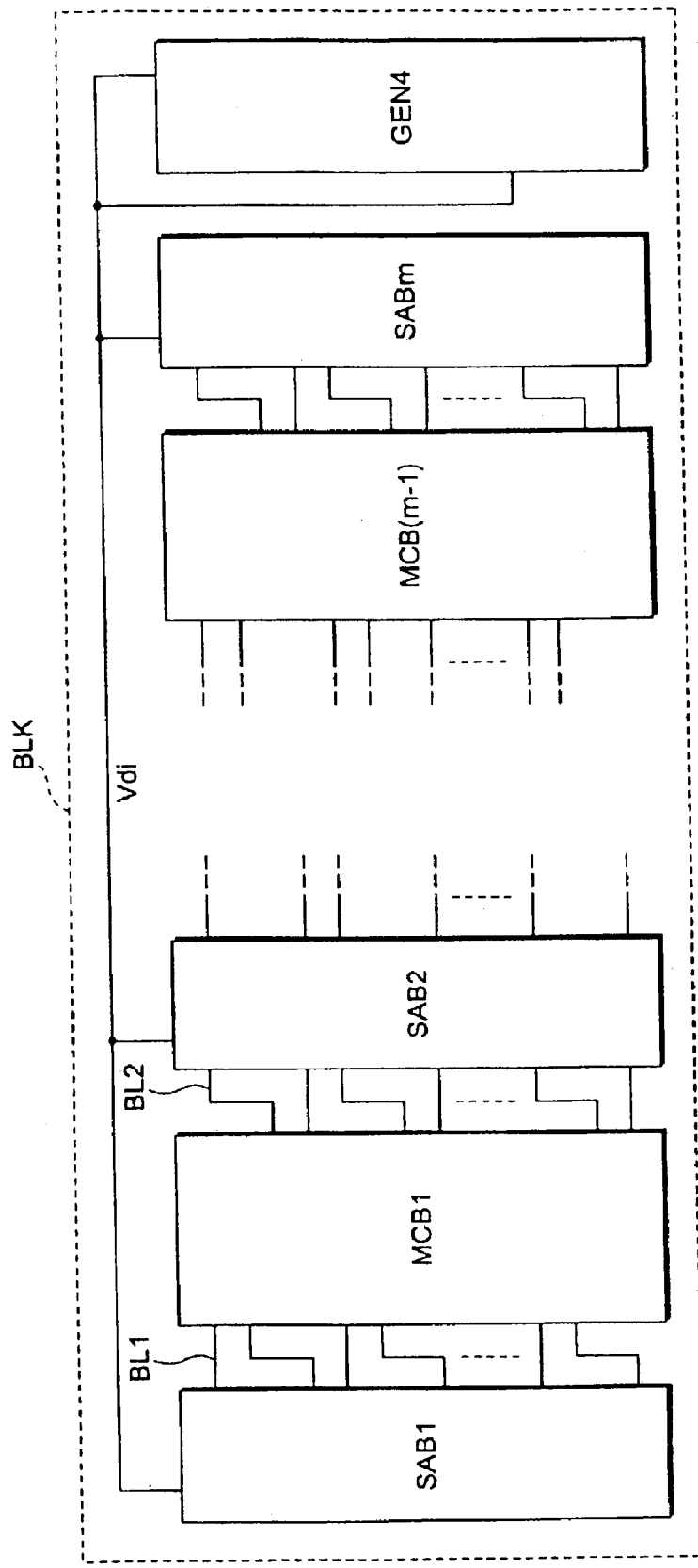
FIG. 6 is a partial block diagram of a memory block.

Referring to FIG. 6, in the general case, a memory block BLK has m sense amplifier arrays SAB1 to SABm, (m−1) memory cell arrays MCB1 to MCB(m−1), and one sense-amplifier power source GEN4, where m is an integer, greater than one, that can be selected according to the required memory capacity. The sense-amplifier power source GEN4 supplies a voltage Vdi somewhat less than Vdd to the sense amplifier arrays. The memory block BLK also includes sub-word line drivers, which have been omitted for simplicity.

Figure 7:
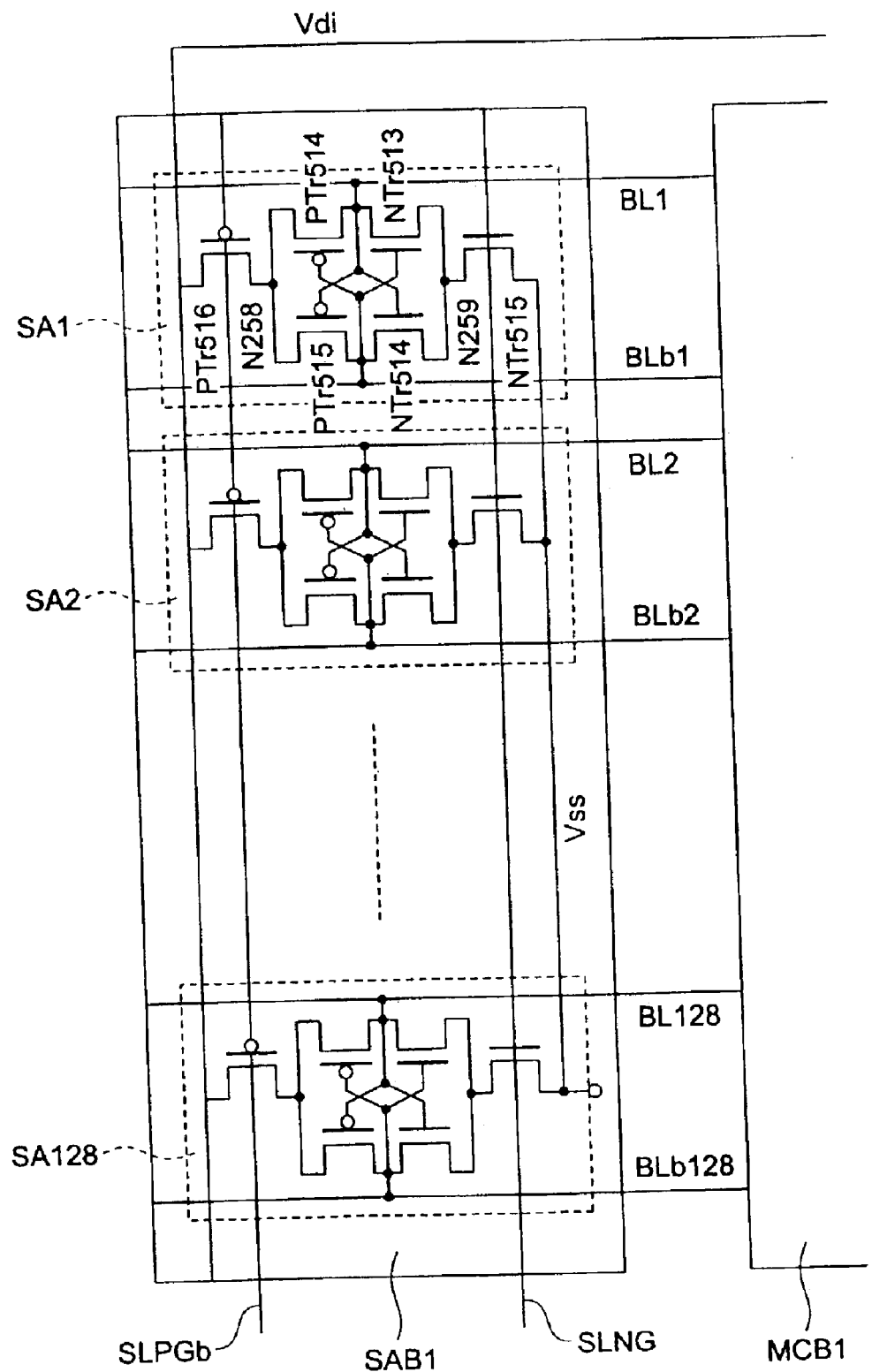
FIG. 7 is a circuit diagram of a sense amplifier array in FIG. 6.

Referring to FIG. 7, each sense amplifier array comprises a plurality of sense amplifiers (SA1 to SA128), all of which are controlled by a complementary pair of sense latch gate signals SLNG and SLPGb. Each sense amplifier has the same structure, so sense amplifier SA1 will be described as an example. SA1 is a differential amplifier comprising NMOS transistors NTr513, NTr514, NTr515 and PMOS transistors PTr514, PTr515, PTr516. Transistors NTr513, NTr514, PTr514, and PTR515 are cross-coupled between bit lines BL1 and BLb1: that is, the gate electrodes of transistors NTr513 and PTr514 and the drain electrodes of transistors NTr514 and PTr515 are coupled to bit line BLb1, while the gate electrodes of transistors NTr514 and PTr515 and the drain electrodes of transistors NTr513 and PTr514 are coupled to bit line BL1. The source electrodes of transistors PTr514 and PTr515 and the drain electrode of transistor PTr516 are interconnected at a node N258. The source electrodes of transistors NTr513 and NTr514 and the drain electrode of transistor NTr515 are interconnected at a node N259. The gate electrodes of transistors NTr515 and PTr516 are coupled to signal lines SLNG and SLPGb, respectively. The source electrode of transistor NTr515 is coupled to ground (Vss), while the source electrode of transistor PTr516 receives the voltage Vdi supplied by the sense-amplifier power source.

The operation of the sense amplifiers will now be described. It will be assumed that all memory cells on the selected word line store '1' data. Initially, SLPGb is held at the Vdd level, SLNG is held at the Vss level, and the bit lines are equalized to a predetermined potential such as ½ Vdd, by an equalizing circuit not shown in the drawings. Next, SLNG is switched to the Vdd level and SLPGb to the Vss level, turning on transistors NTr515 and PTr516 in each sense amplifier. The source electrodes of transistors NTr513 and NTr514 now receive the Vss potential, while the source electrodes of transistors PTr514 and PTr515 receive the Vdi potential.

In the meantime, a selected word line has been driven, turning on the cell transistors in the connected memory cells, so that charge is transferred from their cell capacitors to, for example, bit lines BL1 to BL128, placing these bit lines at a slightly higher potential than bit lines BLb1 to BLb128. Consequently, transistor PTr514 is in a slightly more conductive state than transistor PTr515, and transistor NTr514 is in a slightly more conductive state than transistor NTr513. The slight potential difference between the bit lines is accordingly amplified. Amplification continues until bit lines BL1 to BL128 are at the Vdi level and bit lines BLb1 to BLb128 are at the Vss level. The amplification process consumes considerable current.

Figure 8:
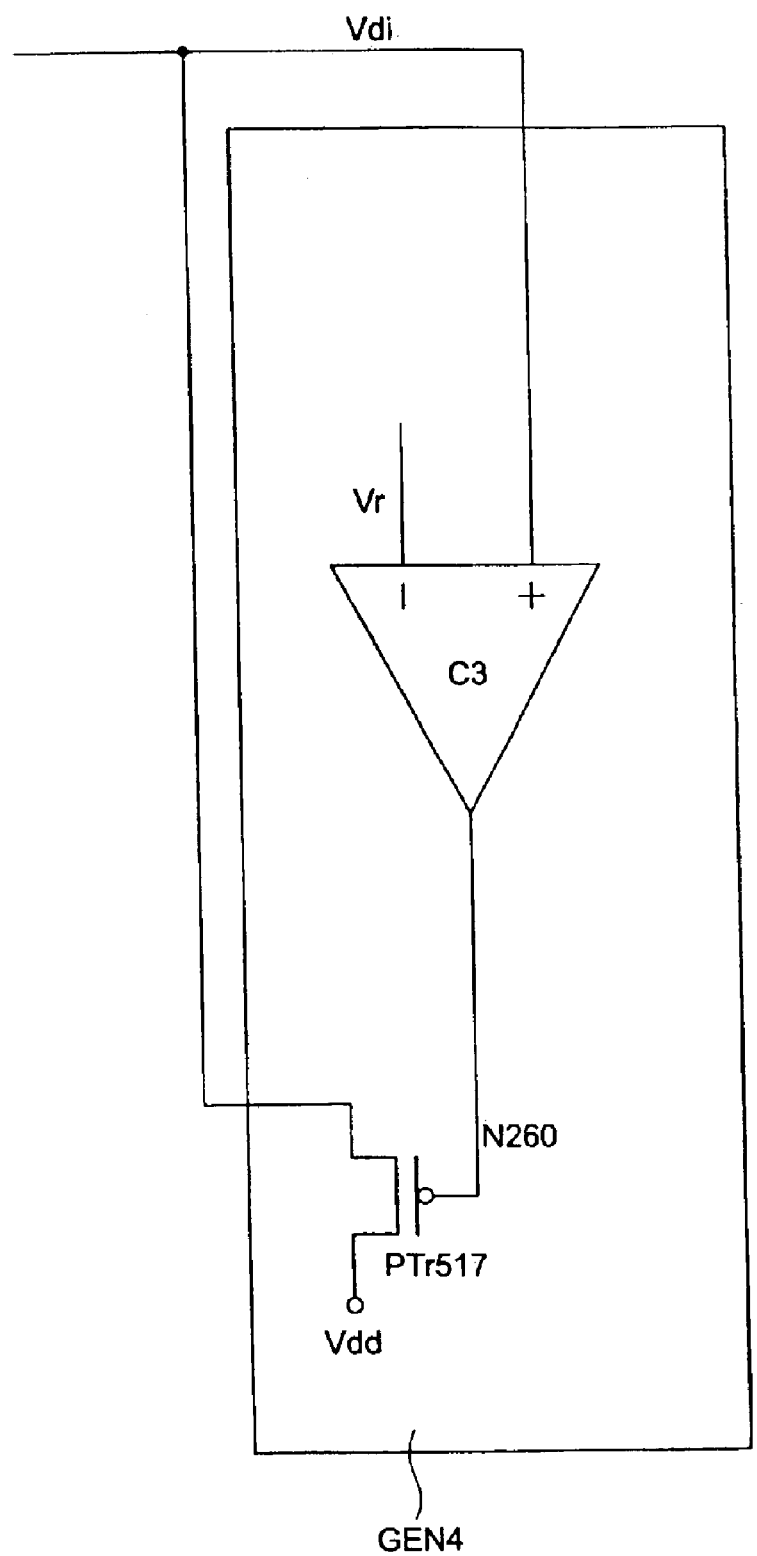
FIG. 8 is a circuit diagram of the sense-amplifier power source in FIG. 6.

Referring to FIG. 8, the conventional sense-amplifier power source GEN4 comprises a comparator C3 and a PMOS transistor PTr517. Comparator C3 has a non-inverting (+) input terminal that receives the voltage Vdi output from the sense-amplifier power source GEN4, and an inverting (−) input terminal that receives a reference voltage Vr. The output of comparator C3 and the gate electrode of transistor PTr517 are interconnected at a node N260. The source electrode of transistor PTr517 receives the supply voltage Vdd. The drain electrode of transistor PTr517 provides the output voltage Vdi of the sense-amplifier power source GEN4.

When the Vdi potential is greater than the reference voltage Vr, comparator C3 drives node N260 to the Vdd level, turning off transistor PTr517. If the Vdi potential falls below the reference voltage Vr, because of current consumption in the sense amplifiers, for example, comparator C3 drives node N260 to the Vdd level, turning transistor PTr517 on. Positive charge is supplied from Vdd to the Vdi line, raising the Vdi potential until it surpasses Vr again. Repetitions of this operation hold the Vdi potential near the reference voltage Vr.

Figure 9:
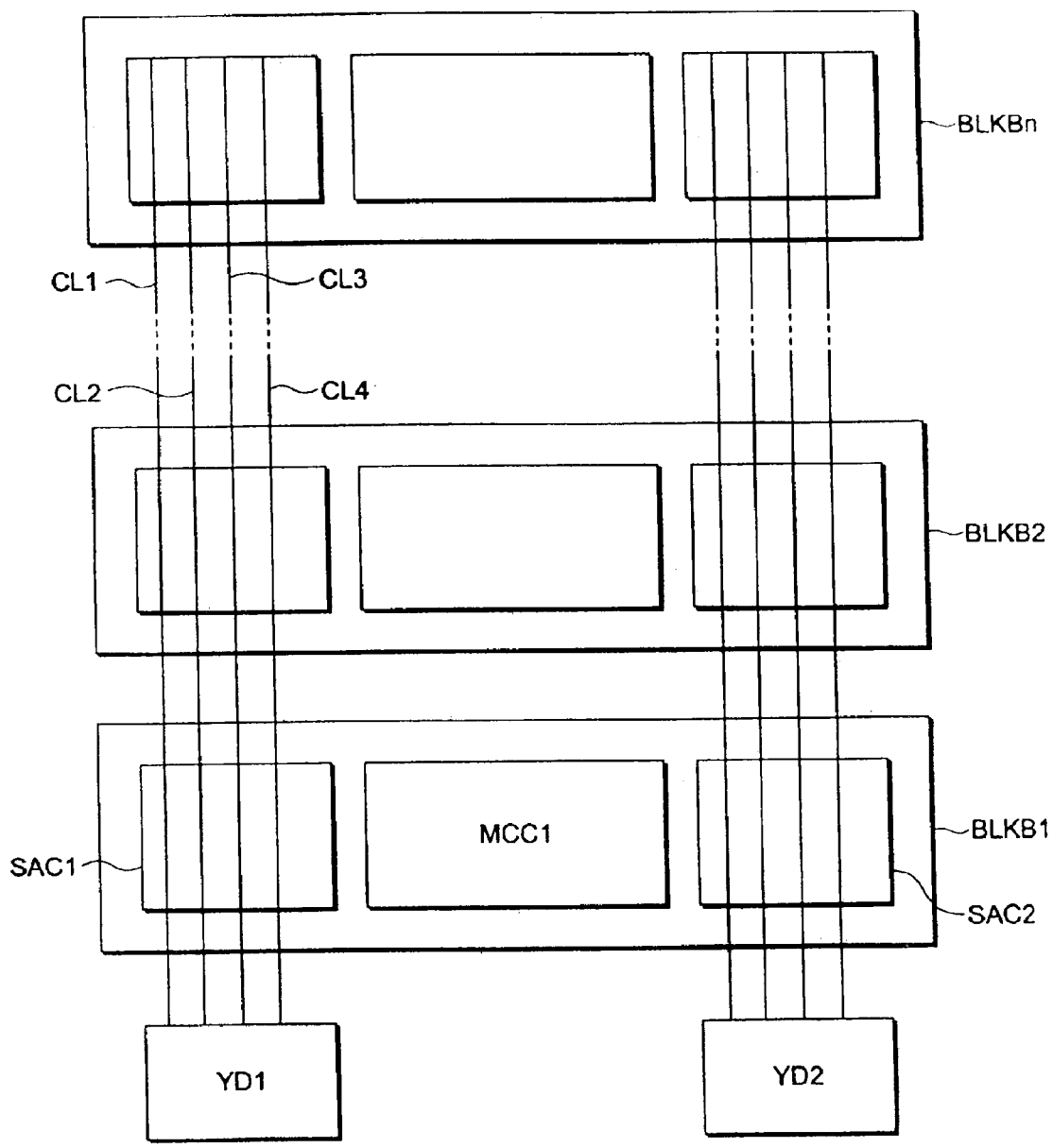
FIG. 9 is a block diagram illustrating memory blocks and y-decoder blocks.

Referring to FIG. 9, the conventional DRAM macro also comprises y-decoder blocks that are linked to the sense amplifier arrays by column lines. For simplicity, the case in which each memory block BLKB1, BLKB2, . . . , BLKBn has just one memory cell array MCC1 and two sense amplifier arrays SAC1, SAC2 is illustrated. In this case there are two y-decoder blocks YD1, YD2. Each y-decoder drives, for example, four column lines CL1, CL2, CL3, CL4.

Figure 10:
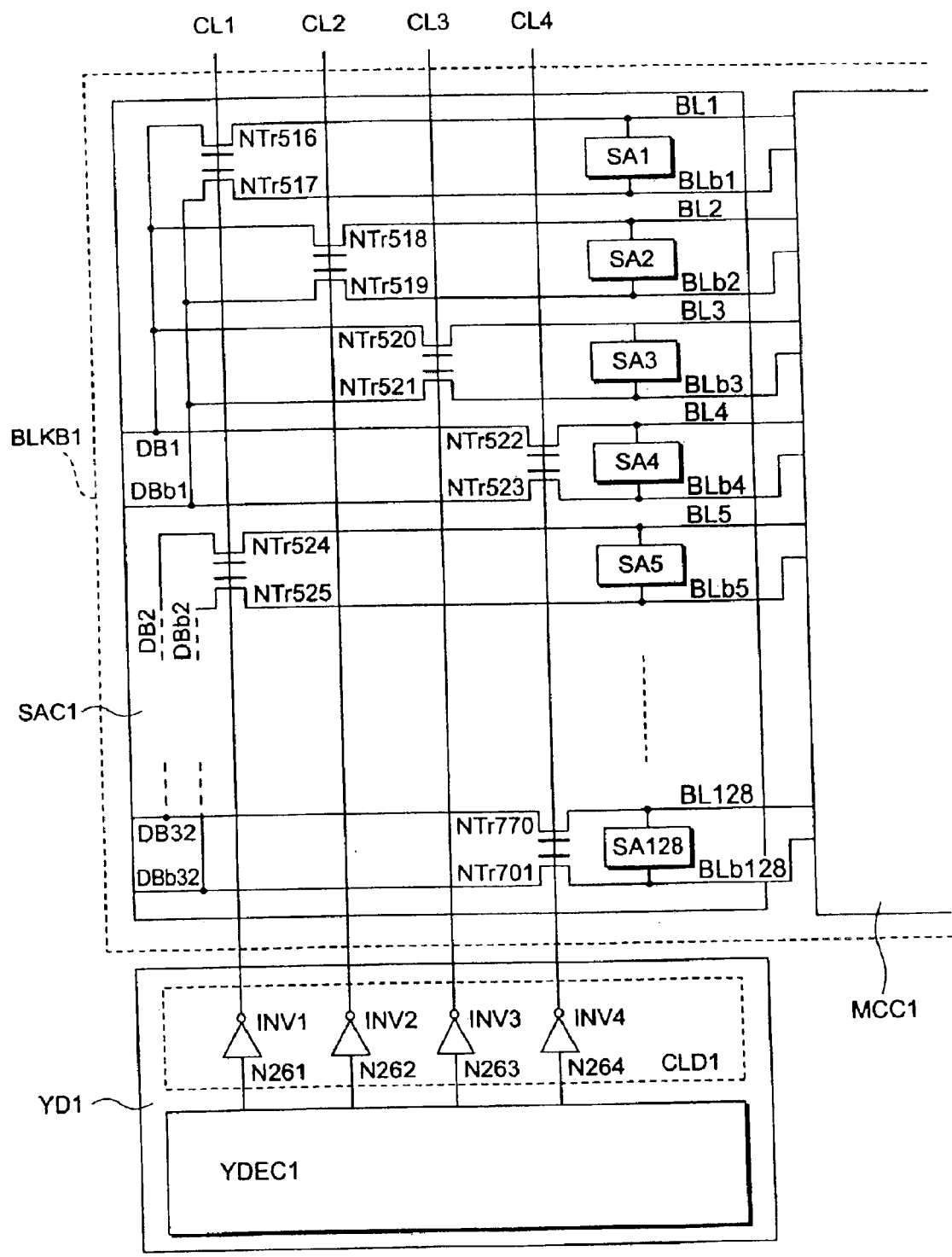
FIG. 10 is a circuit diagram of a y-decoder block.

Referring to FIG. 10, a y-decoder block such as YD1 comprises a y-decoder YDEC1 and a column line driver CLD1. The column line driver comprises inverters INV1 to INV4, the input terminals of which are coupled to the y-decoder YDEC1 at respective nodes N261 to N264. The output terminals of inverters INV1 to INV4 are coupled to the column lines CL1 to CL4. The y-decoder YDEC1 controls nodes N261 to N264 by decoding external address signals (not visible).

The corresponding sense amplifier array SAC1 includes the sense amplifiers SA1 to SA128 described above, and NMOS transistors NTr516 to NTr771. The source electrodes of, for example, the first pair of transistors NTr516, NTr517 are coupled to a pair of complementary data bus lines DB1, DBb1. The gate electrodes of these transistors NTr516, NTr517 are coupled to the first column line CL1. The drain electrodes of transistors NTr516, NTr517 are coupled to the pair of bit lines BL1, BLb1 that are coupled to the first sense amplifier SA1.

The second pair of transistors NTr518, NTr519 are similarly coupled to data bus lines DB1 and DBb1, column line CL2, and bit lines BL2, BLb2. The third pair of transistors NTr520, NTr521 are coupled to data bus lines DB1 and DBb1, column line CL3, and bit lines BL3, BLb3. The fourth pair of transistors NTr522, NTr523 are coupled to data bus lines DB1 and DBb1, column line CL4, and bit lines BL4, BLb4. This pattern then repeats with a new pair of data bus lines DB2, DBb2 and further bit lines. In all, there are thirty-two complementary pairs of data bus lines, each pair receiving data from four sense amplifiers.

In the initial state, y-decoder YDEC1 holds nodes N261 to N264 at the Vdd level, which is the non-selected level, and inverters INV1 to INV4 drive the column lines CL1 to CL4 to the Vss level, turning transistors NTr516 to NTr771 all off. If, for example y-decoder YDEC1 then receives a signal selecting node N261, it switches this node to the Vss level, causing inverter INV1 to drive column line CL1 to the Vdd level. The NMOS transistors with gate electrodes coupled to this column line CL1 are thereby turned on, and conduct data from the sense amplifiers to the data bus lines. Nodes N262 to N264 remain at the Vdd level, and column lines CL2 to CL4 at the Vss level, so each pair of data bus lines receives data from only one sense amplifier.

The problems mentioned in the background of the invention can now be understood more concretely.

In FIG. 2, the same word-line voltage boosting circuit GEN3 is employed regardless of the number (n) of memory blocks. Since current consumption increases as n increases, the capacitors CAP1, CAP2 shown in FIG. 5 must be large enough to keep the boosted word-line potential Vpp at the necessary level even when n has the maximum permitted value. Consequently, when there are fewer than this maximum number of memory blocks, capacitors CAP1, CAP2 are unnecessarily large, and layout space is wasted.

In FIG. 3, the same x-decoder blocks are used regardless of the number (n) of memory blocks. Since the electrical resistance and parasitic capacitance of the main word lines increases with n, as does the gate capacitance of the sub-word line drivers, the main word line drivers require enough driving capability for the maximum permitted value of n. That is, the transistors in the main word line drivers must be large enough (wide enough) to provide this maximum needed driving capability. When the number of memory blocks is less than the maximum, accordingly, the transistors in the main word line drivers are larger than necessary, and layout space is wasted again. Moreover, the main word line drivers consume unnecessarily large amounts of current when being switched between the high and low output levels.

In FIG. 6, the same sense-amplifier power source GEN4 is employed regardless of the size of the memory blocks. Since current consumption increases as the number of sense amplifiers (m) increases, transistor PTr517 in FIG. 8 must be large (wide) enough to keep the Vdi line adequately supplied with current even when the memory blocks have the maximum permitted size, with the maximum number of sense amplifier arrays. When smaller memory blocks are employed, transistor PTr517 is unnecessarily large, and once again, layout space is wasted.

In FIG. 9, the same y-decoder blocks YD1, YD2 are employed, regardless of the number (n) of memory blocks. Since the electrical resistance and parasitic capacitance of the column lines CL1 to CL4 increases with n, as does the total gate capacitance of all the NMOS transistors driven by the column lines (transistors NTr516 to NTr771 in FIG. 10), inverters INV1 to INV4 require enough driving capability for the maximum permitted value of n. That is, the transistors in these inverters must be large (wide) enough for the maximum value of n. When the number of memory blocks is less than the maximum, accordingly, these inverters are larger than necessary, and layout space is wasted yet again. Moreover, the unnecessarily large inverters consume unnecessarily large amounts of current when being switched.

As a first embodiment of the invention, a memory macro that solves the first of these problems will now be described. Like the conventional memory macro described above, this embodiment is a DRAM macro in which the number and size of the memory blocks can be varied to provide a desired memory capacity.

Figure 11:
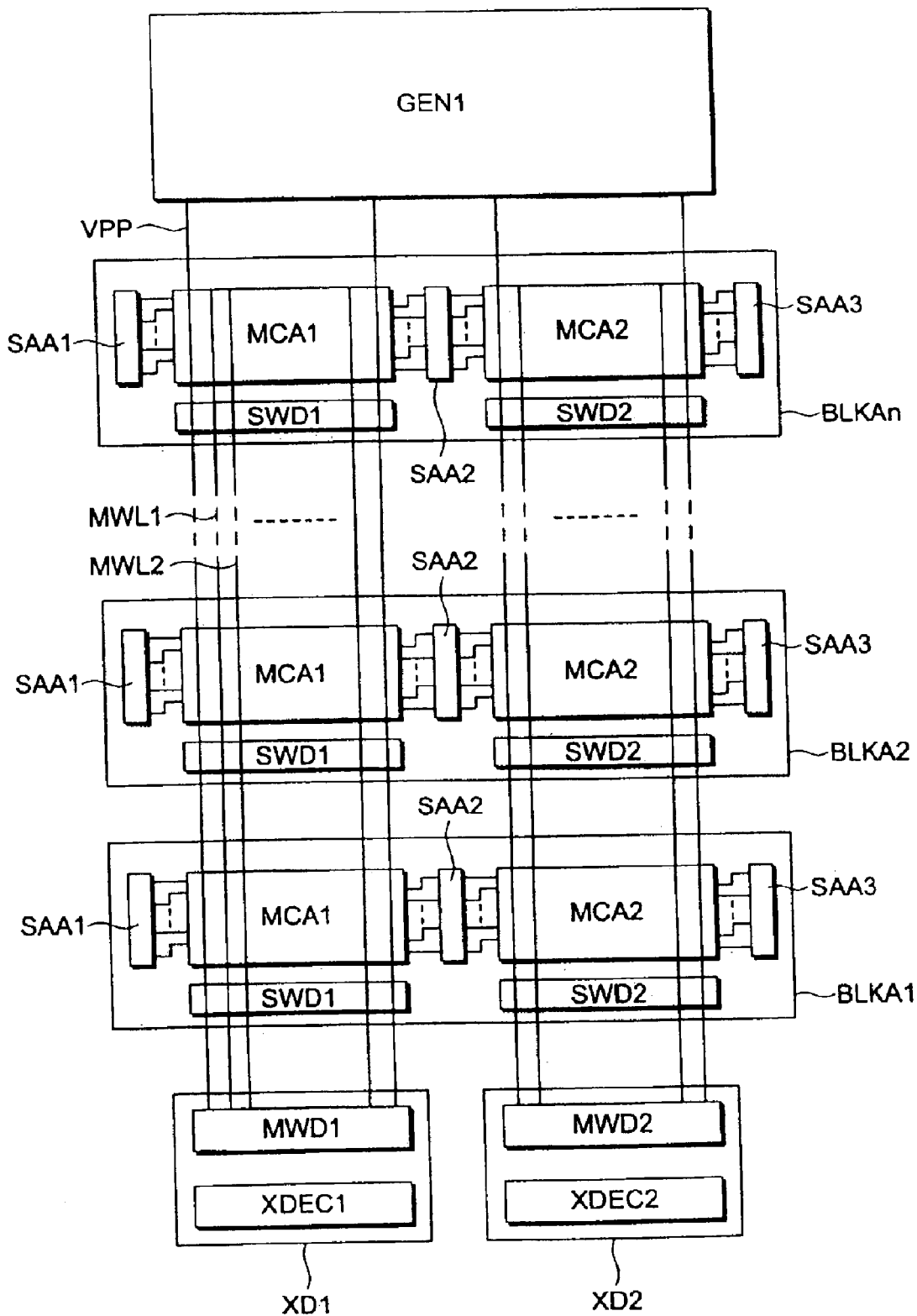
FIG. 11 is a block diagram of a DRAM macro illustrating a first embodiment of the invention.

Referring to FIG. 11, the first embodiment comprises a word-line voltage boosting circuit GEN1, one or more x-decoder blocks XD1, XD2, and n memory blocks BLKA1 to BLKAn, where n is an arbitrary positive integer. The memory blocks have the conventional structure, each comprising, for example, a pair of memory cell arrays MCA1, MCA2 and their associated circuits. The associated circuits include a pair of sub-word line drivers SWD1, SWD2, and sense amplifier arrays SAA1, SAA2, SAA3. The x-decoder blocks also have the conventional structure, comprising respective main word line drivers MWD1, MWD2 and x-decoders XDEC1, XDEC2. The main word line drivers are linked to the sub-word line drivers by main word lines MWD1, MWD2, . . . . The word-line voltage boosting circuit GEN1 provides a boosted voltage Vpp to the sub-word line drivers and main word line drivers on a plurality of voltage supply lines VPP.

The memory cell arrays are disposed in an m×n matrix, where m is equal to two in the example shown. The matrix aligns n memory cell arrays per column in one direction (the vertical direction in the drawing), and aligns m memory cell arrays per row in the perpendicular direction (the horizontal direction in the drawing).

Figure 12:
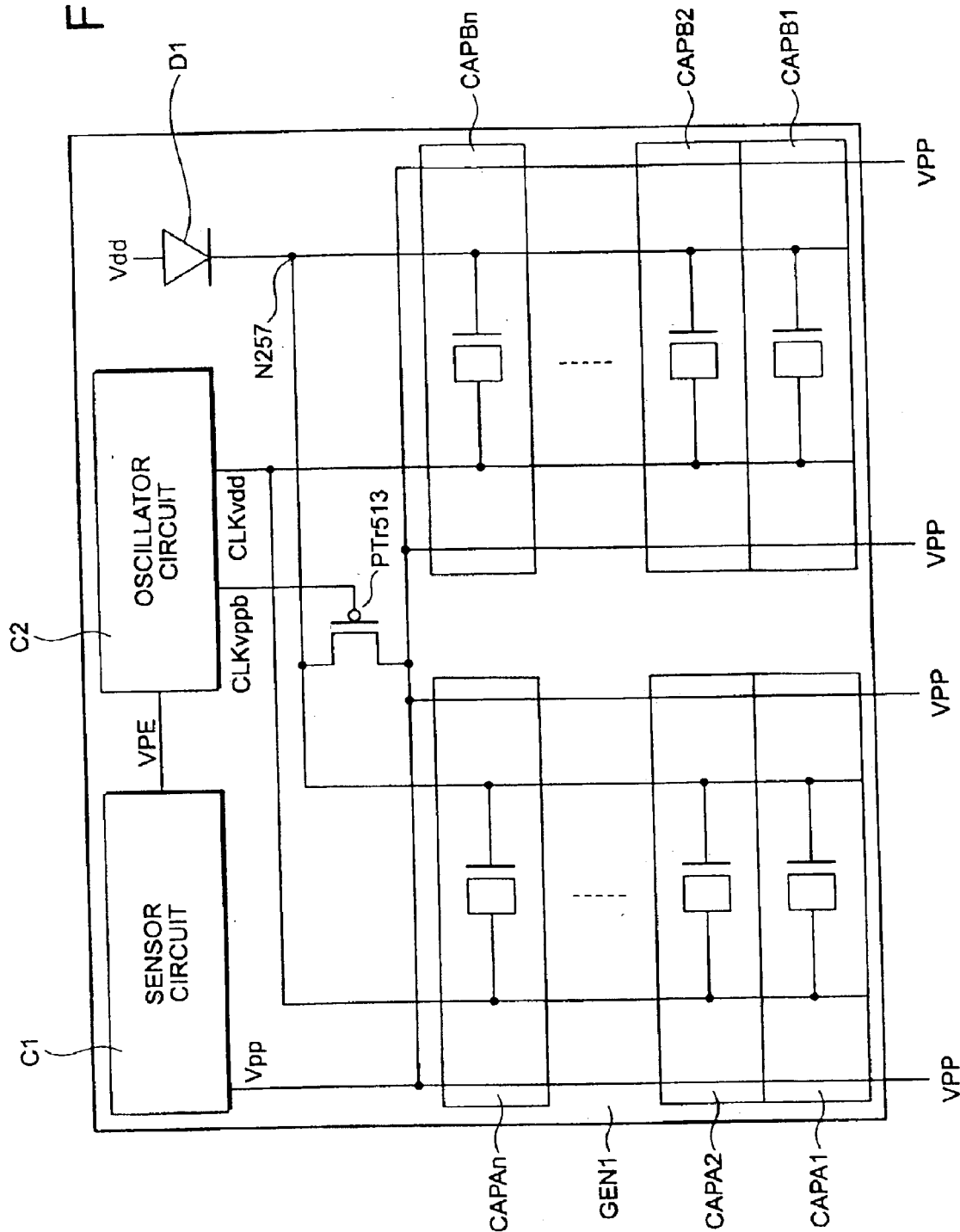
FIG. 12 is a circuit diagram of the boosted word line voltage generator in FIG. 11.

Referring to FIG. 12, the word-line voltage boosting circuit GEN1 comprises a sensor circuit C1, an oscillator circuit C2, a PMOS transistor PTr513, and a diode D1, which are interconnected as in the conventional circuit GEN3. The diode D1 comprises, for example a PMOS transistor with a source electrode coupled to the power supply Vdd and gate and drain electrodes both coupled to node N257, to which the source electrode of PMOS transistor Ptr513 is connected.

The word-line voltage boosting circuit GEN1 also comprises n pairs of NMOS capacitors CAPA1 to CAPAn and CAPB1 to CAPBn, where n is the number of memory blocks. All of these capacitors are coupled in parallel between node N257 and the CLKvdd output terminal of the oscillator circuit C2. Capacitors CAPA1 to CAPAn are disposed side by side in one column, aligned with the left memory cell arrays MCA1 in each memory block in FIG. 11; capacitors CAPB1 to CAPBn are disposed side by side in another column, aligned with the right memory cell arrays MCA2 in each memory block. The number of columns of capacitors corresponds to the number of memory cell arrays per memory block in FIG. 11. The total number of capacitors is thus equal to the total number of memory cell arrays in the memory blocks.

Figure 13:
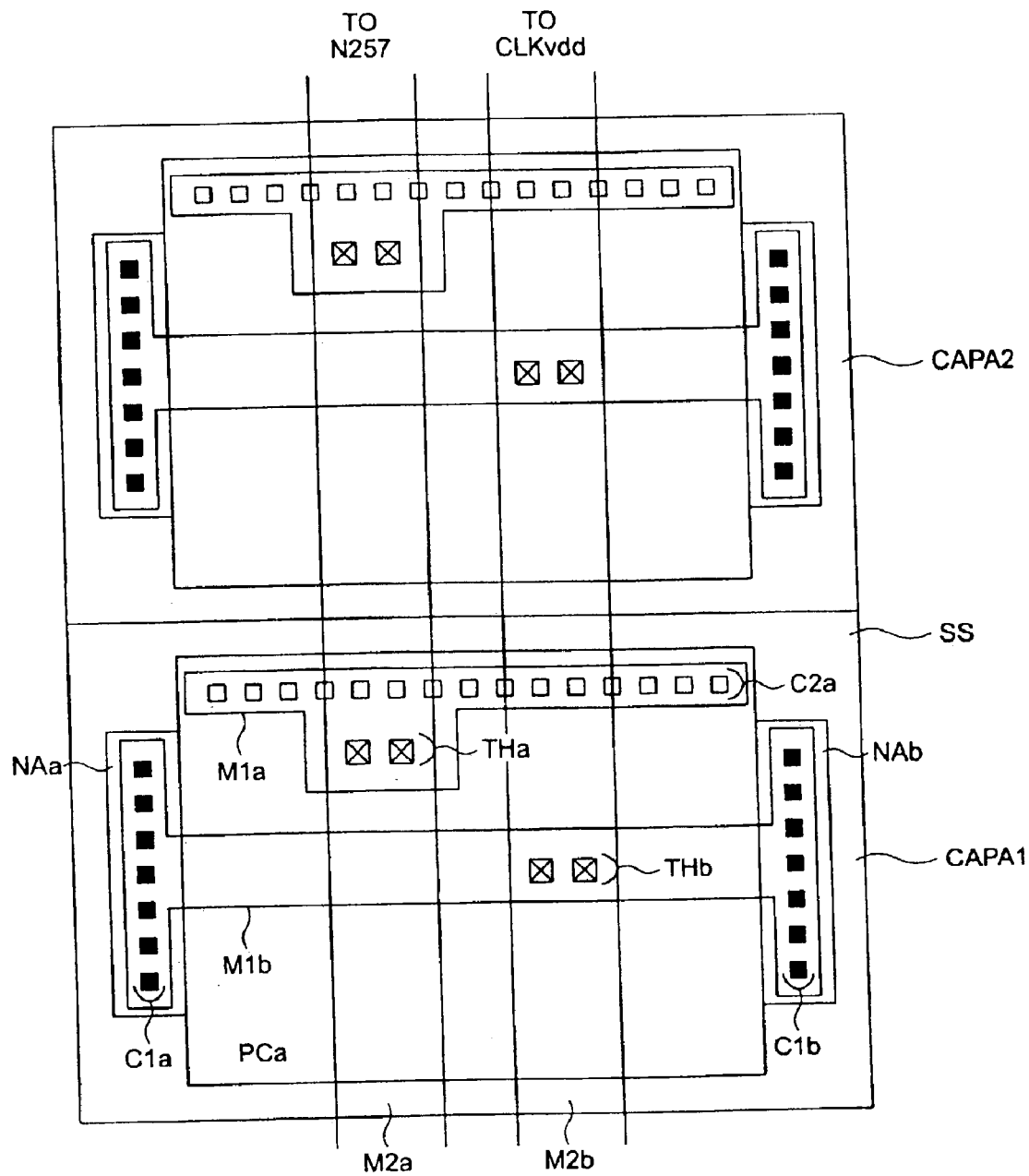
FIG. 13 is a plan view of the layout of two adjacent capacitors in the circuit in FIG. 12.

FIG. 13 shows the layout of two adjacent capacitors, taking CAPA1 and CAPA2 as an example. Each capacitor is similar in structure to an NMOS transistor with interconnected source and drain regions and an enlarged gate. The source and drain regions NAa, NAb are n⁺-type regions formed by doping of the semiconductor substrate SS with an electron-donor impurity such as phosphorus or arsenic at a high concentration. The gate region PCa is a polycrystalline silicon film to which a refractory metal such as tungsten has been added, forming a conductive gate material referred to as polycide. The gate region PCa is separated from the underlying substrate, including the source and drain regions NAa, NAb, by a gate oxide layer (not visible).

This structure is overlain by two layers of metal interconnections. The first metal layer includes a gate electrode M1a that is electrically coupled to the gate region PCa, and a source-drain electrode M1b that is electrically coupled to the source and drain regions NAa, NAb. The electrical coupling is effected by contacts C1a, C1b, C2a extending through contact holes in an interlayer dielectric material, not explicitly shown. The second metal layer includes an interconnecting line M2a coupled to the gate electrode M1a via through-holes THa, and another interconnecting line M2b coupled to the source-drain electrode M1b via through-holes THb. The first interconnecting line M2a leads to node N257; the second interconnecting line M2b leads to the CLKvdd output terminal of the oscillator circuit C2. These two interconnecting lines M2a, M2b extend through the entire column of capacitors from CAPA1 to CAPAn in FIG. 12, coupling CAPA1 to CAPAn in parallel between node N257 and the CLKvdd output terminal.

The word-line voltage boosting circuit GEN1 operates in substantially the same way as the word-line voltage boosting circuit GEN3 described earlier. Clock signals CLKvdd and CLKvppb are complementary. When CLKvdd is low (Vss) and CLKvppb is high (Vpp), node N257 charges to the Vdd potential level through diode D1, positive charge being stored in the gate regions PCa of capacitors CAPA1 to CAPAn and CAPB1 to CAPBn. When CLKvdd goes high (Vdd), node N257 is boosted by capacitive coupling to twice the Vdd potential, and positive charge flows from the gate regions PCa of capacitors CAPA1 to CAPAn and CAPB1 to CAPBn through node N257 and PMOS transistor PTr513 to the VPP supply lines, raising the Vpp potential.

The rate at which positive charge can be supplied to the VPP supply lines is proportional to the total capacitance of capacitors CAPA1 to CAPAn and CAPB1 to CAPBn. The rate at which the supplied charge is consumed by current flow in the main word line drivers and sub-word line drivers is proportional to the total number of memory cell arrays in the memory blocks. The individual capacitors CAPA1 to CAPAn and CAPB1 to CAPBn are sized to keep the rate of supply in balance with the rate of consumption.

The first embodiment provides the word-line voltage boosting circuit GEN1 with adequate capacitance for the number (n) of memory blocks, without wasting space by providing more than the needed amount of capacitance. The word-line voltage boosting circuit GEN1 is moreover easy to design and fabricate, requiring only that the capacitors in each column be placed side by side and connected to the metal lines M1a and M1b. The first embodiment is thus suitable for automated design methods. The design of capacitor CAPA1 shown in FIG. 13, for example, can be stored in a database or library and copied into the positions of capacitors CAPA1 to CAPAn and CAPB1 to CAPBn. The stored design includes contact holes and through-holes, so the necessary interconnections are made automatically.

Figure 14:
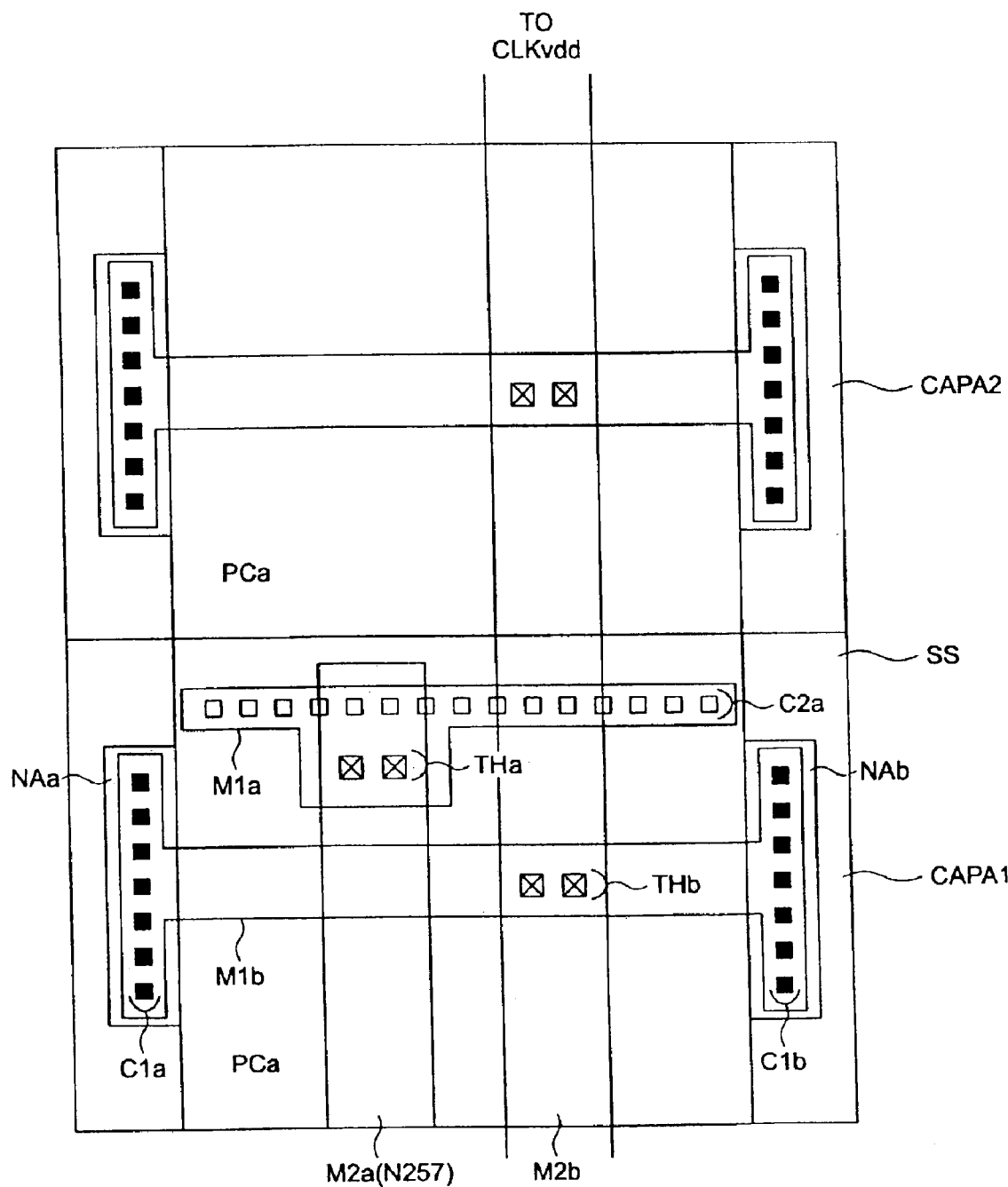
FIG. 14 is a plan view of an alternate layout of two adjacent capacitors in the circuit in FIG. 12.

Referring to FIG. 14, in a variation of the first embodiment, the gate region PCa in each capacitor extends the full length each capacitor, so that the gate regions PCa of adjacent capacitors (e.g., CAPA1 and CAPA2) join together and are electrically continuous. In this variation, it is only necessary to provide a single gate electrode M1a for an entire column of capacitors (e.g., CAPA1 to CAPAn), and interconnecting line M2a can be shortened accordingly.

Figure 15:
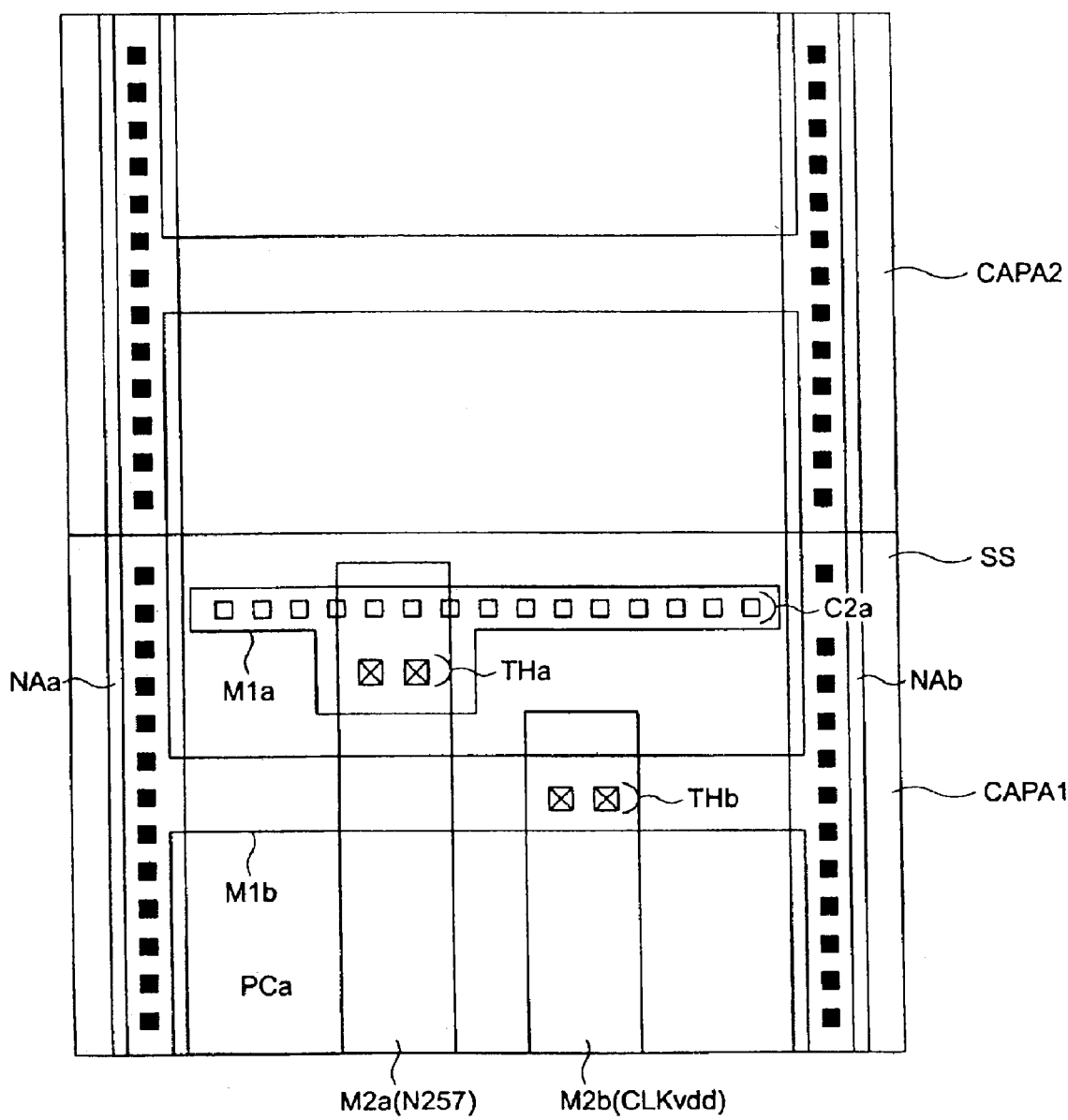
FIG. 15 is a plan view of another alternate layout of two adjacent capacitors in the circuit in FIG. 12.

Referring to FIG. 15, in a further variation of the first embodiment, the source and drain regions NAa, NAb also extend the full length of each capacitor, so that the source and drain regions of adjacent capacitors (e.g., CAPA1 and CAPA2) are electrically continuous. In this variation, interconnecting line M2b can be shortened by having it make electrical contact with only one capacitor in the column.

In these variations, even though the capacitors in each column are partly joined together, they are laid out as separate capacitors during the design process.

Figure 16:
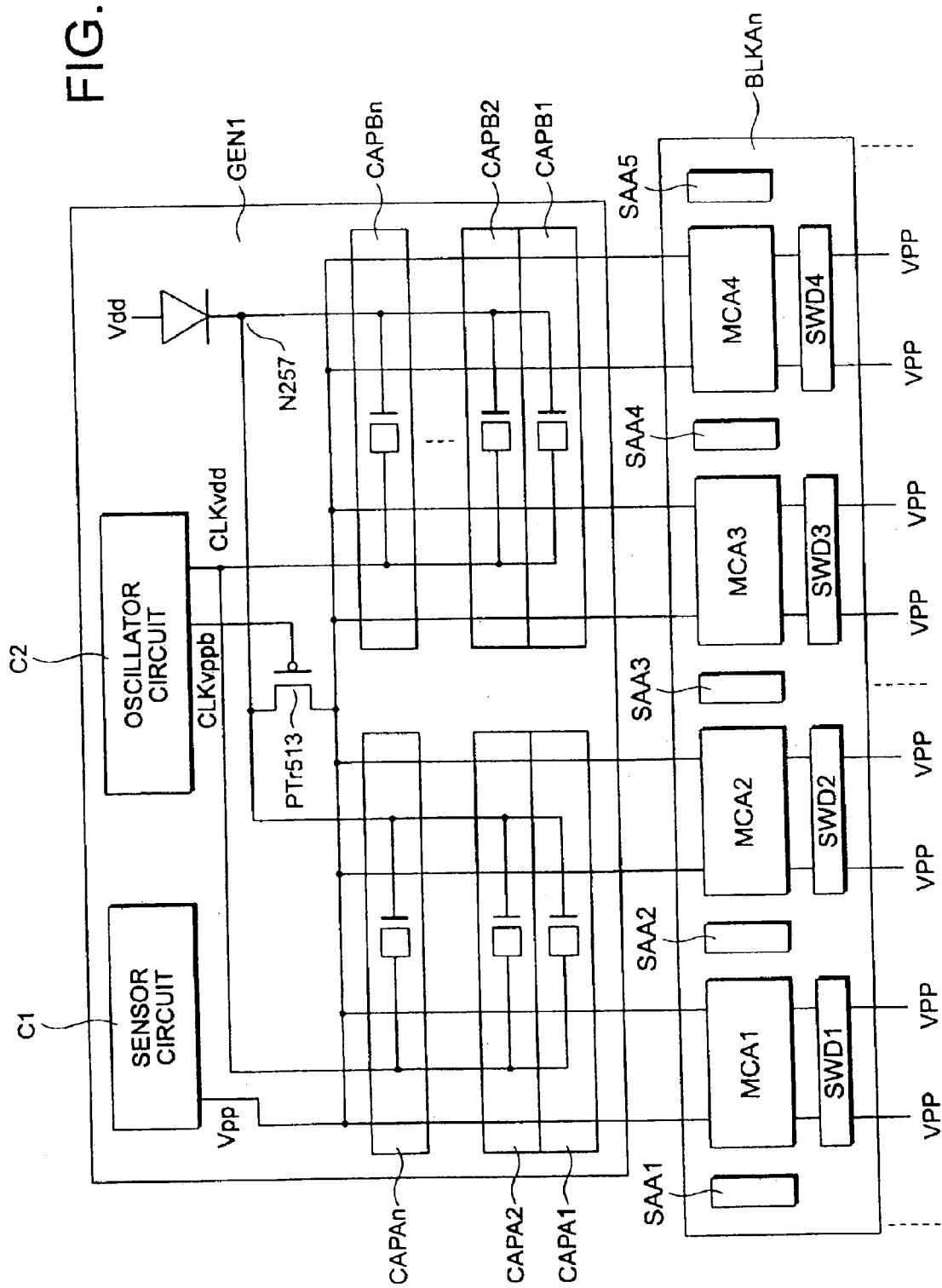
FIG. 16 is an alternative circuit diagram of the boosted word line voltage generator in FIG. 11.

Referring to FIG. 16, in another variation of the first embodiment, there is one column of capacitors in the word-line voltage boosting circuit GEN1 for every two columns of memory cell arrays in the n memory blocks (of which only the last memory block BLKAn is shown). In this example there are four memory cell arrays MCA1, MCA2, MCA3, MCA4 per memory block, hence two columns of capacitors CAPA1 to CAPAn and CAPB1 to CAPBn.

More generally, there may be any number of columns of capacitors in the word-line voltage boosting circuit, and each column of capacitors may correspond to any number of memory cell arrays per memory block. Each column of n capacitors may thus store sufficient charge for k×n memory cell arrays, where k is a positive integer not exceeding the number of memory cells per memory block.

As a second embodiment of the invention, a DRAM macro that solves the problem of the size of the main word line drivers will be described. This DRAM macro has the same general configuration as the first embodiment, shown in FIG. 11, with n memory blocks, each having two memory cell arrays.

Figure 17:
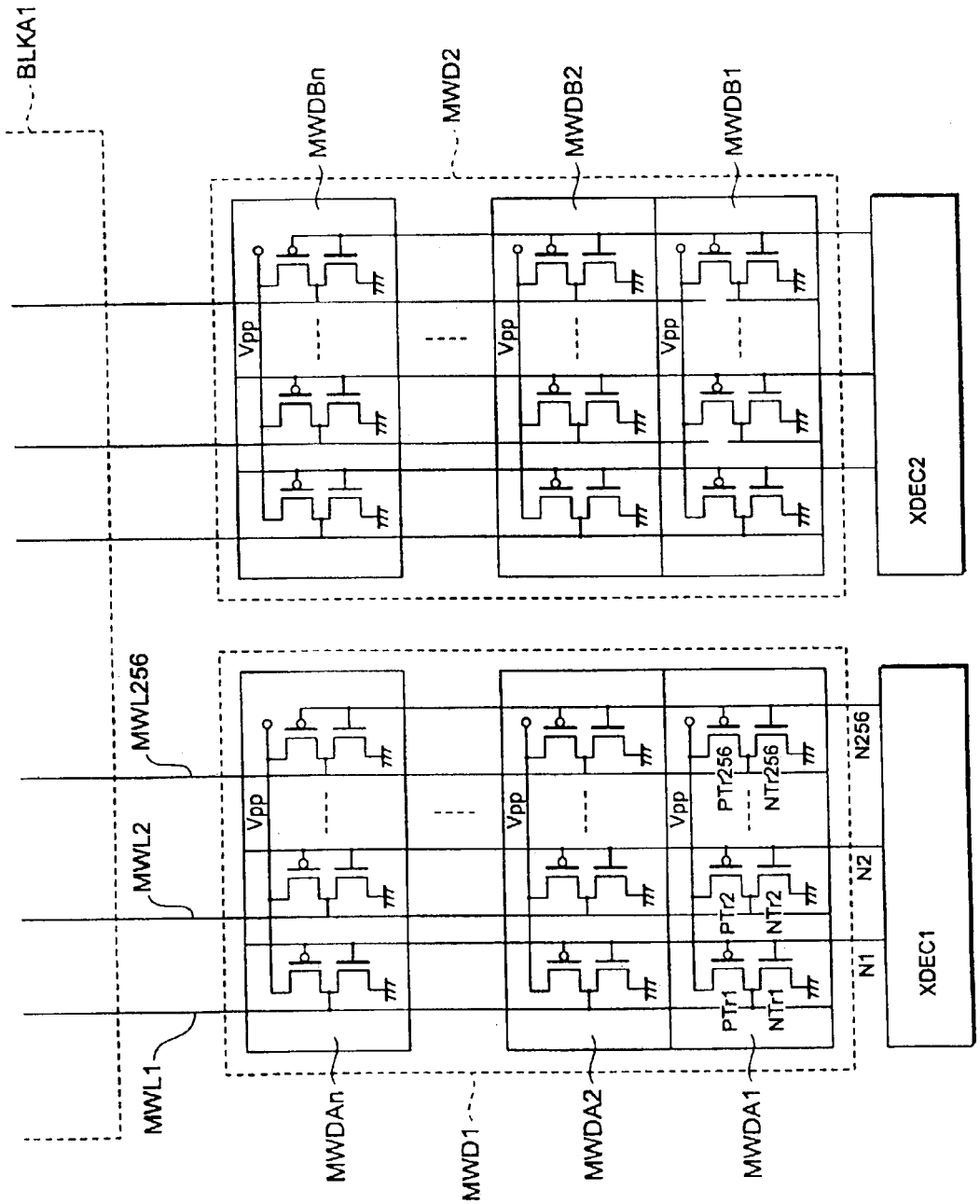
FIG. 17 is a circuit diagram of the main word line drivers in a second embodiment of the invention.

FIG. 17 shows the internal structure of the two main word line drivers MWD1, MWD2 in the second embodiment. Main word line driver MWD1 comprises n unit main word line drivers MWDA1 to MWDAn, which are coupled in parallel to the main word lines MWL1, MWL2, . . . , MWLn. Main word line driver MWD2 has a similar structure with n unit main word line drivers MWDB1, MWDB2, . . . , MWDBn.

Each unit main word line driver has the conventional structure, comprising PMOS transistors PTr1 to PTr256 and NMOS transistors NTr1 to NTr256 coupled to form inverters that drive the main word lines. The source electrodes of the NMOS transistors are coupled to ground, the source electrodes of the PMOS transistors are coupled to the VPP supply lines (not visible) that supply the Vpp potential, the gate electrodes of both the PMOS and NMOS transistors are coupled to the corresponding output nodes N1 to N256 of the x-decoders XDEC1, XDEC2, and the drain electrodes of both the PMOS and NMOS transistors are coupled to the corresponding main word lines MWL1 to MWL256.

Figure 18:
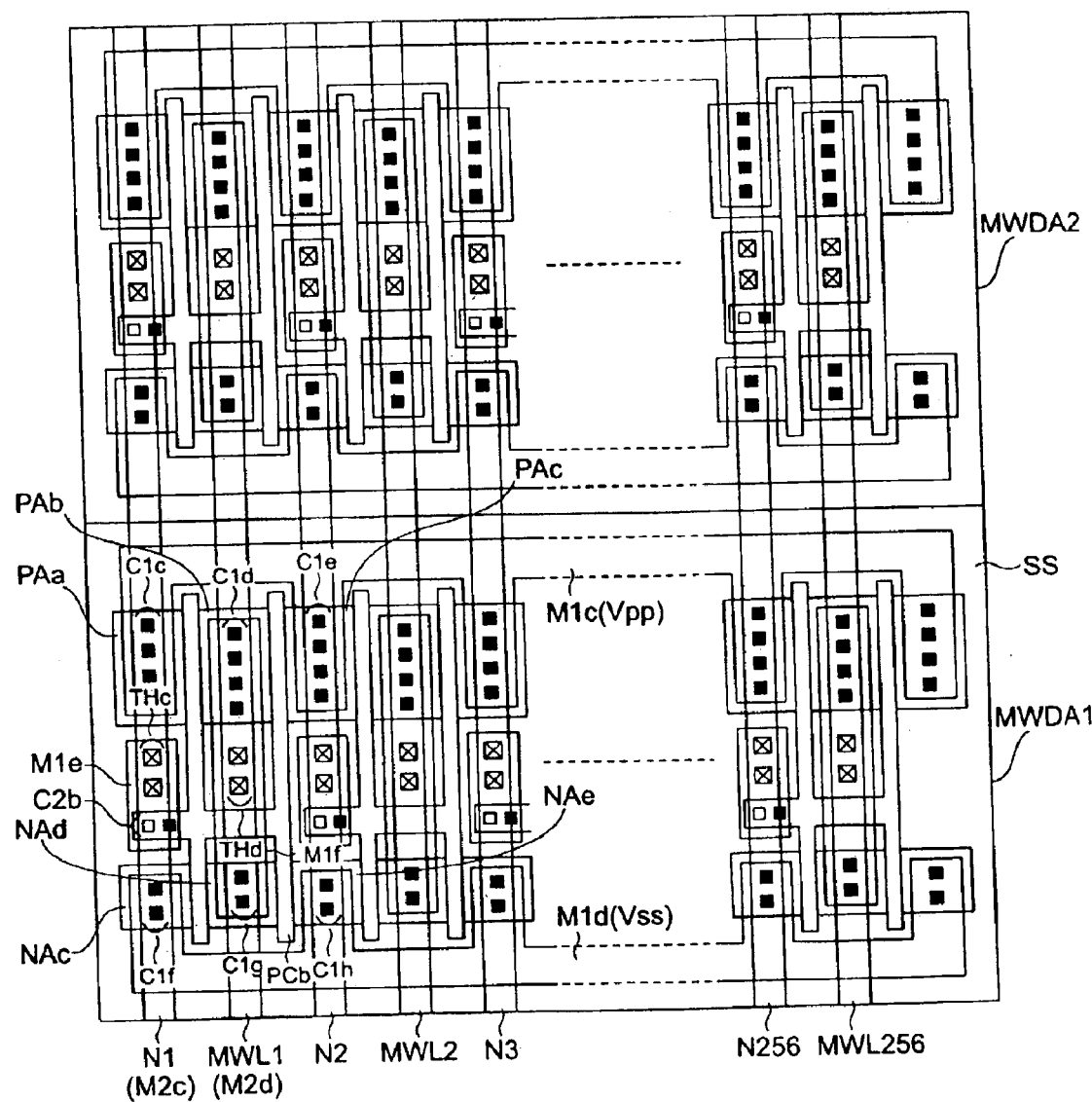
FIG. 18 is a plan view of the layout of two adjacent unit main word line drivers in FIG. 17.

FIG. 18 shows the layout of two adjacent unit main word line drivers, taking MWDA1 and MWDA2 as an example. The first PMOS transistor in unit main word line driver MWDA1 comprises a p$^+$-type source region PAa, a p$^+$-type drain region PAb, and another p$^+$-type source region PAc which is shared with the second PMOS transistor. These regions are formed by doping of the semiconductor substrate SS with an electron-acceptor impurity such as boron or aluminum at a high concentration. The first NMOS transistor comprises an n$^+$-type source region NAc, an n$^+$-type drain region NAd, and another n$^+$-type source region NAe which is shared with the second NMOS transistor. The first PMOS and NMOS transistors share the same polycide gate PCb.

There are two metal interconnection layers. The first layer includes an interconnecting line M1c that couples the source regions PAa, PAc, etc. of the PMOS transistors to a Vpp node (not visible), an interconnecting line M1d that couples the source regions NAc, NAe, etc. of the NMOS transistors to a ground node (not visible), a gate electrode M1e coupled to the polycide gate PCb of the first PMOS and NMOS transistors, a drain electrode M1f coupled to the drain regions PAb, NAd of the first PMOS and NMOS transistors, and similar gate and drain electrodes for the other transistors. These metal lines and electrodes are coupled to the source and drain of the first PMOS transistor by contacts C1c, C1d, C1e, to the source and drain of the first NMOS transistor by contacts C1f, C1g, C1h, and to the polycide gate PCb by contacts C2b.

The second metal interconnection layer includes the main word lines such as MWL1 (M2d), which is coupled via through-holes THd to the drain electrode M1f of the first PMOS and NMOS transistors, and decoder output lines such as the output line (M2c) joining the gate electrode M1e of the first PMOS and NMOS transistors to output node N1. For convenience, this decoder output line is also denoted N1.

The PMOS and NMOS transistors in each unit main word line driver are sized to have a driving capability suitable for one memory block; that is, to be able to switch the inverters in one sub-word line driver on and off at the required speed. The appropriate size of the PMOS and NMOS transistors in the unit main word line drivers depends on the gate capacitance of the inverters in the sub-word line drivers, and the parasitic resistance and capacitance of the main word lines.

The total driving capability of the n unit main word line drivers MWDA1 to MWDAn is thus sufficient for driving the inverters in the sub-word line drivers in all n memory blocks BLKA1 to BLKAn, but space is not wasted by providing more than the necessary driving capability. Besides saving space, reducing the driving capability of the main word line drivers to just the necessary amount also reduces current consumption in the main word line drivers during switching between the high (Vpp) and low (Vss) output states.

The second embodiment lends itself to automated design methods, because it is only necessary to place n unit main word line drivers side by side. The design of one unit main word line driver can be stored as a module in a database or library and copied the necessary number of times.

Figure 19:
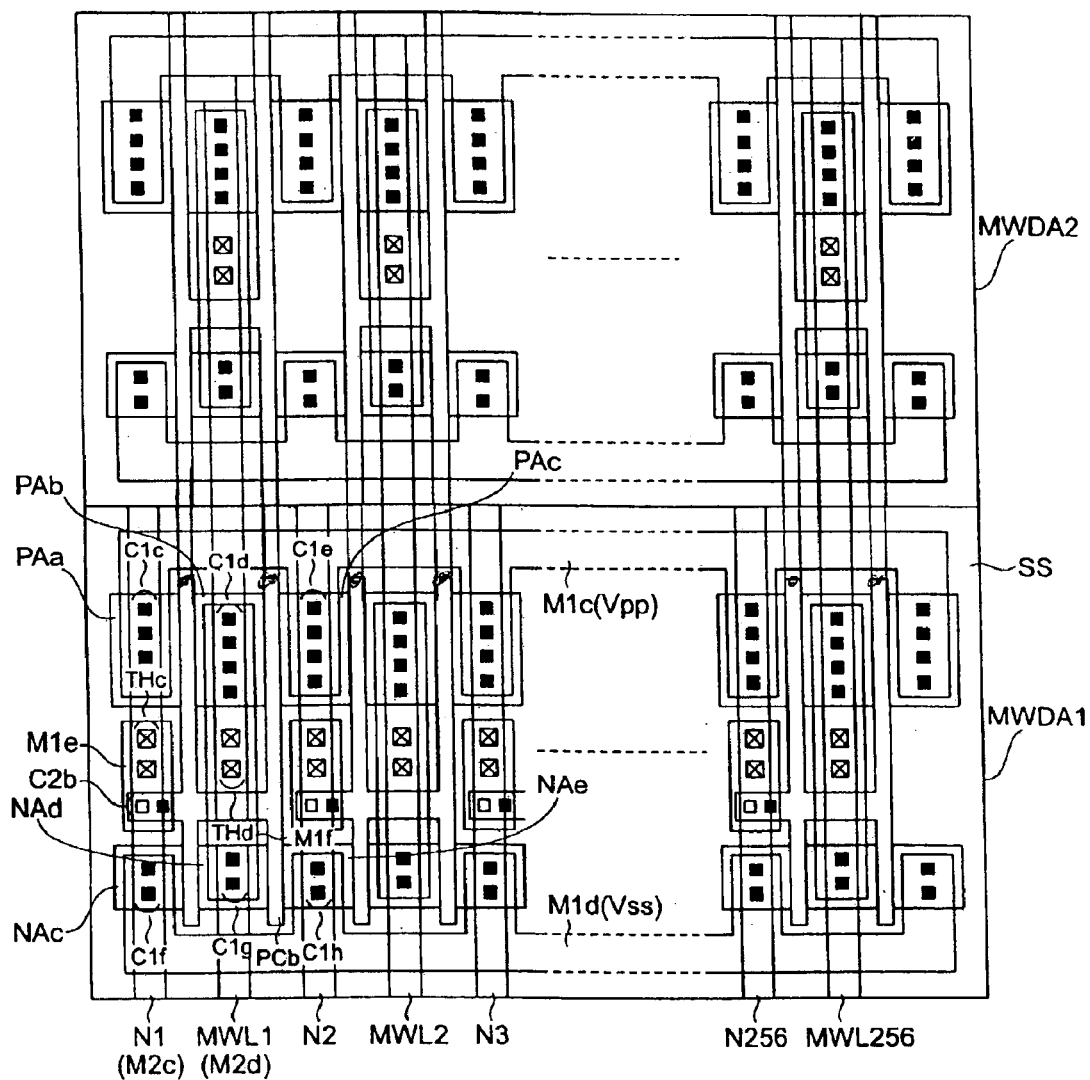
FIG. 19 is a plan view of an alternate layout of two adjacent unit main word line drivers in FIG. 17.

Referring to FIG. 19, in a variation of the second embodiment, the gates of corresponding transistors in the different unit word line drivers are interconnected directly by extensions of the gate polycide material. For example, gate PCb extends from unit word line driver MWDA1 into unit word line driver MWDA2, forming polycide interconnecting lines. Gate electrodes such as M1e are then necessary only in the first unit word line driver MWDA1, and the x-decoder output lines N1, N2, etc. only have to extend as far as this unit word line driver MWDA1.

It is also possible to use polycide interconnecting lines to interconnect the PMOS drain regions of one unit main word line driver to the NMOS drain regions of the next unit main word line driver, enabling the main word lines to be shortened.

As a third embodiment of the invention, a DRAM macro that solves the problem of the size of the sense-amplifier power sources will now be described. Each memory block in this DRAM macro has the general configuration shown in FIG. 6, with m sense amplifier arrays SAB1 to SABm, but the conventional power source GEN4 is replaced by the sense-amplifier power source GEN2 described below.

Figure 20:
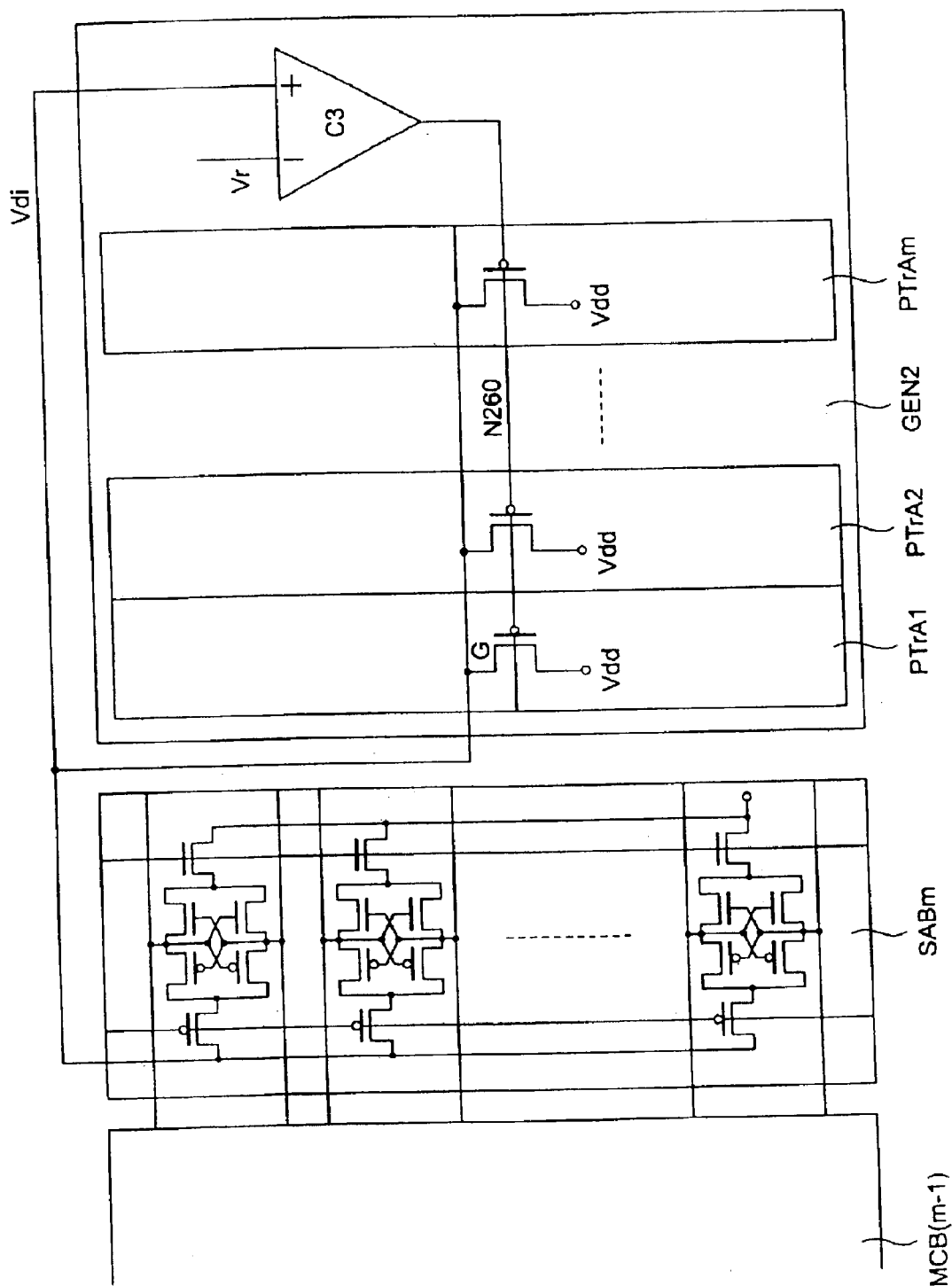
FIG. 20 is a circuit diagram of the sense-amplifier power source in a third embodiment of the invention.

Referring to FIG. 20, this sense-amplifier power source GEN2 comprises a comparator circuit C3 and m PMOS transistors PTrA1 to PTrAm. Like the conventional sense-amplifier power source GEN4, sense-amplifier power source GEN2 supplies an output voltage Vdi somewhat lower than the supply voltage Vdd to the sense amplifiers. The comparator circuit C3 compares the output voltage Vdi with a reference voltage Vr. The output signal line or node N260 of the comparator circuit C3 is coupled to the gate electrodes of the m PMOS transistors PTrA1 to PTrAm. The source electrode of each of these PMOS transistors is coupled to the power supply Vdd; the drain electrodes of these PMOS transistors are coupled in common to the Vdi output line.

Figure 21:
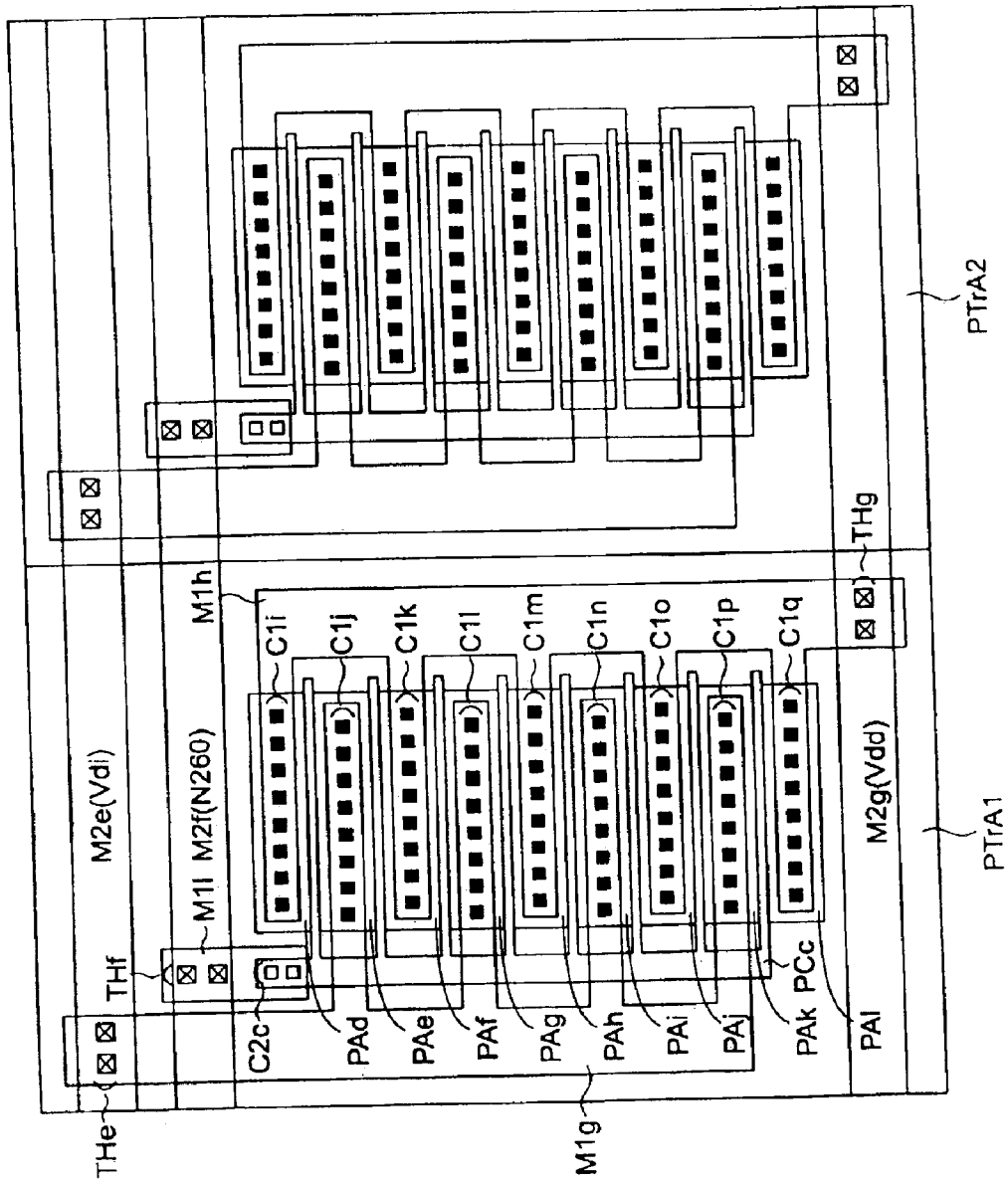
FIG. 21 is a plan view of the layout of two adjacent transistors in FIG. 21.

FIG. 21 shows the layout of two adjacent PMOS transistors. PMOS transistor PTrA1 comprises an alternating series of p$^+$-type source regions PAd, PAf, PAh, PAj, PAl and p$^+$-type drain regions PAe, PAg, PAi, PAk, mutually separated by channel regions (not visible) disposed beneath a polycide gate PCc. The drain regions are coupled by contacts C1j, C1l, C1n, C1p, the source regions by contacts C1i, C1k, C1m, C1o, C1q, and the polycide gate PCc by contacts C2c to respective electrodes M1g, M1h, M1i in a first metal interconnection layer. The drain electrode M1g is coupled via through-holes THe, the gate electrode M1*i* via through-holes THf, and the source electrode M1*h* via through-holes THg to respective interconnecting lines M2*e*, M2*f*, and M2*g* in a second metal interconnection layer. The other PMOS transistors, such as PTrA2, have the same structure.

Interconnecting line M2*e*, coupled to the drain electrodes of all the PMOS transistors, is the Vdi output line of the sense-amplifier power source. Interconnecting line M2*f*, coupled to the gate electrodes of all the PMOS transistors, is the output line or node N260 of the comparator circuit C3. Interconnecting line M2*g* couples the source electrodes of all the PMOS transistors to the power supply Vdd.

Each PMOS transistor in this layout is designed to provide sufficient current for one sense amplifier array. Since the number of PMOS transistors is equal to the number of sense amplifier arrays (m) in the memory block, adequate current is provided without wasting layout space by providing unneeded current-conducting capability.

The third embodiment lends itself to automated design methods, since it is only necessary to place m identical PMOS transistors side by side. The design of one of these transistors can be stored as a module in a database or library and copied the necessary number of times.

Figure 22:
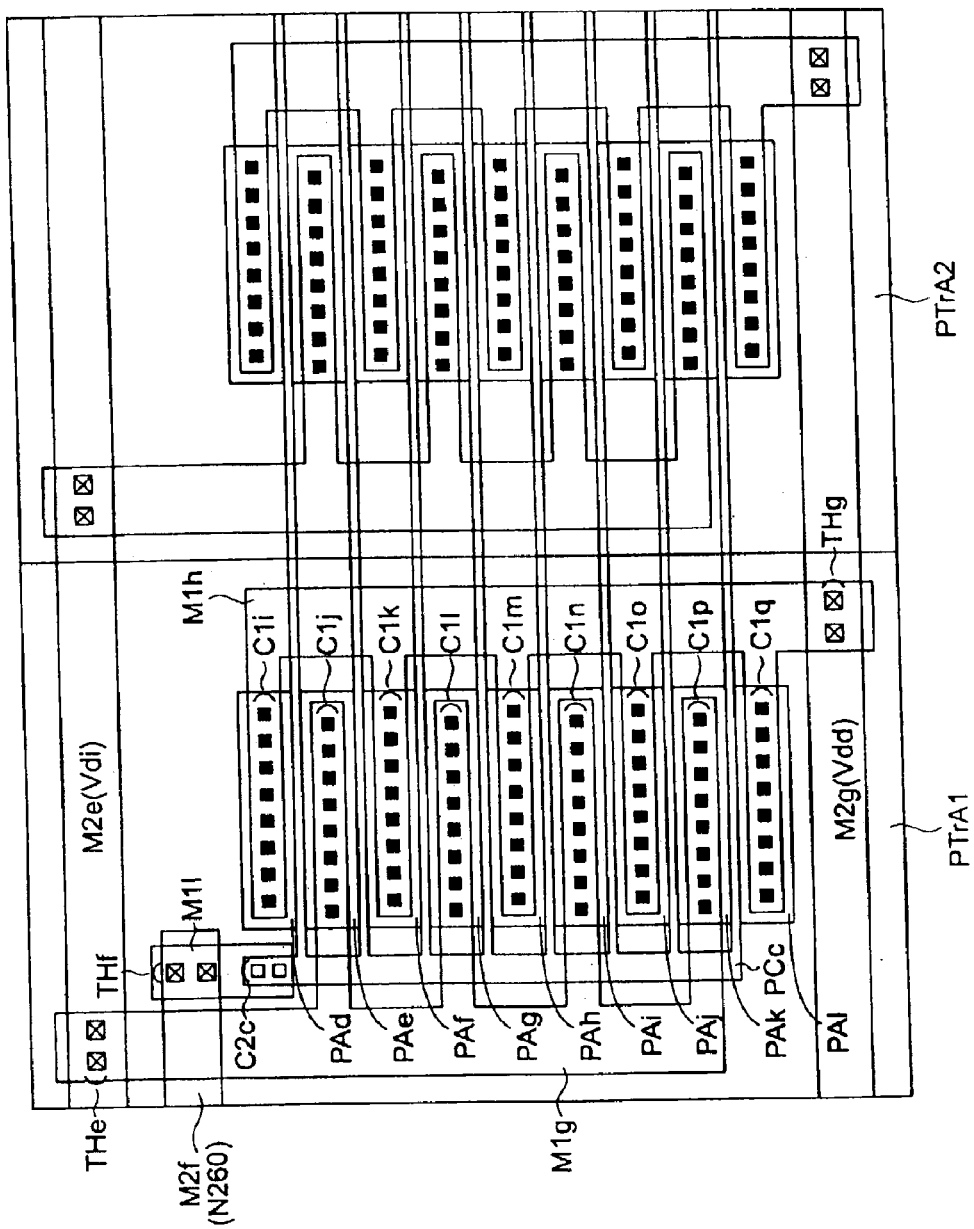
FIG. 22 is a plan view of an alternate layout of two adjacent transistors in FIG. 21.

Referring to FIG. 22, in a variation of the third embodiment, the polycide gates PCc of the PMOS transistors are directly joined, instead of being interconnected by metal electrodes and lines. Metal interconnecting line M2*f* can thereby be shortened, and metal gate electrode M1*i* is needed only in one of the PMOS transistors PTrA1 to PTrAm.

Figure 23:
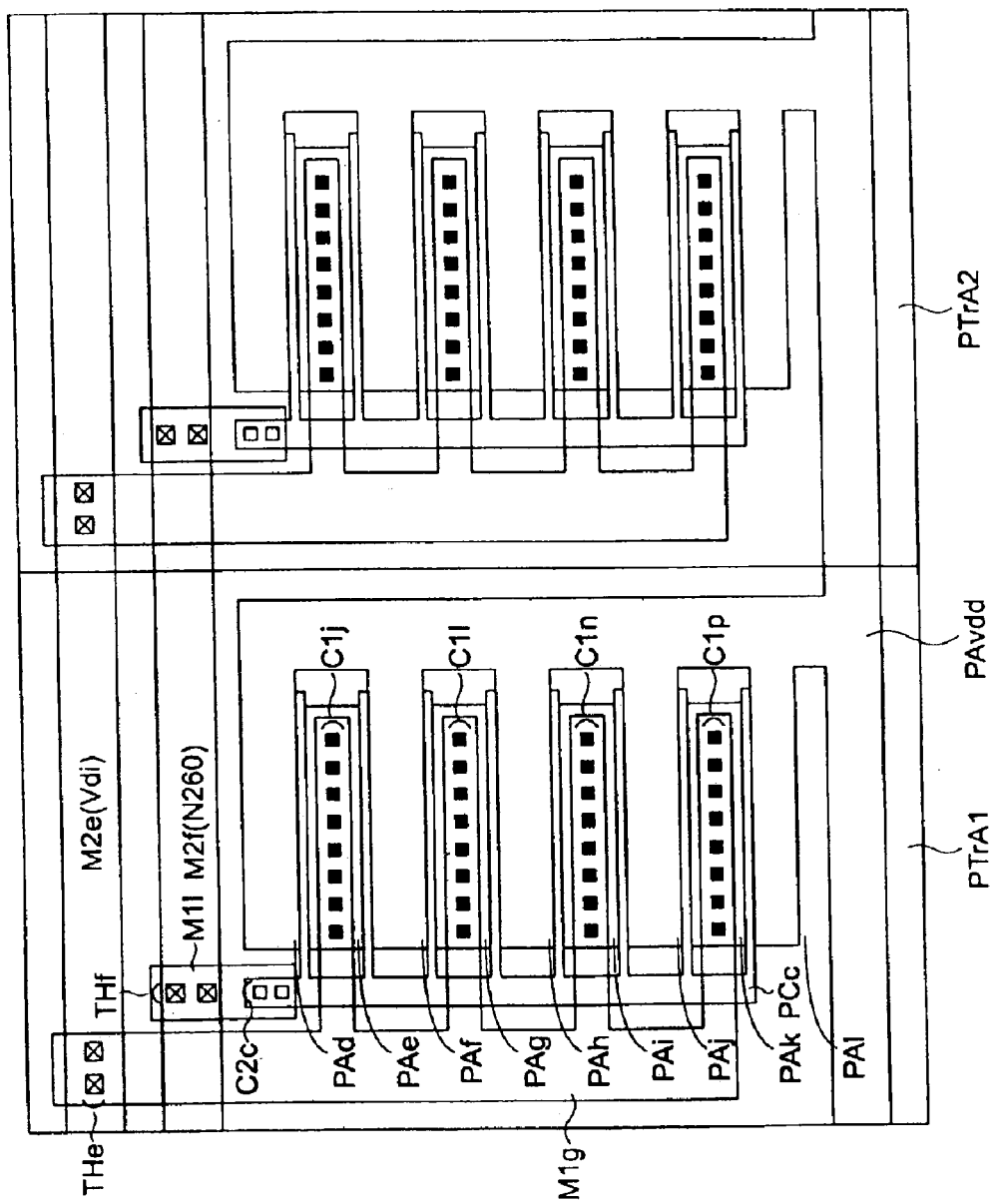
FIG. 23 is a plan view of another alternate layout of two adjacent transistors in FIG. 21.

Referring to FIG. 23, in another variation of the third embodiment, the source doping of the PMOS transistors is extended to form a p$^+$-type region PAvdd that directly interconnects all of the source regions in all of the PMOS transistors, replacing the metal electrode M1*h* and line M2*g* in FIG. 21. Alternatively, the drain regions of the PMOS transistors can be interconnected in this way by an extended p$^+$-type region. It is also possible to use polycide to interconnect the source regions, or drain regions, or to use p$^+$-type substrate material to interconnect the gates of the PMOS transistors.

Figure 24:
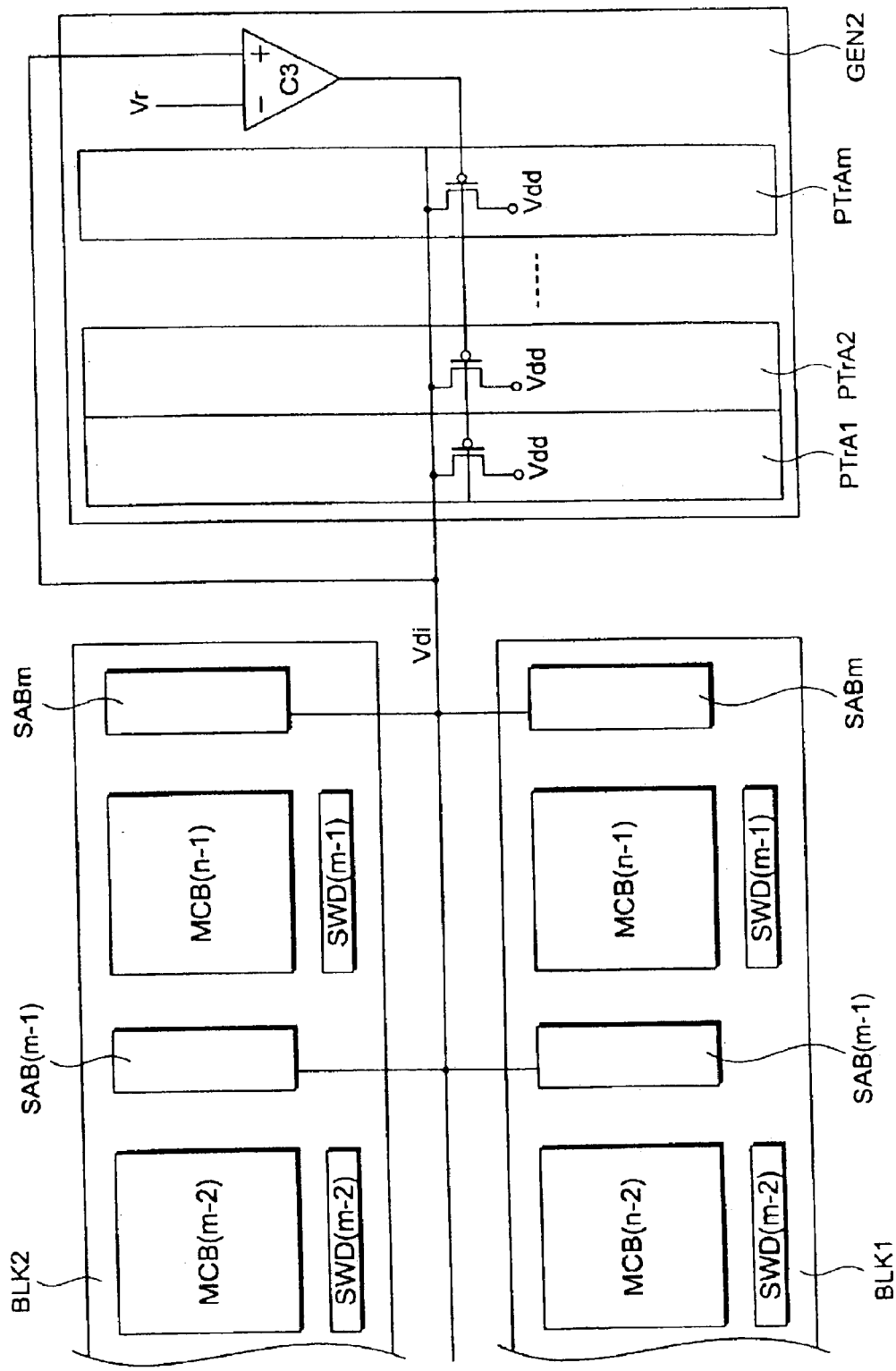
FIG. 24 is an alternative circuit diagram of the sense-amplifier power source in the third embodiment.

Referring to FIG. 24, in yet another variation of the third embodiment, a single sense-amplifier power source GEN2 supplies Vdi to the sense amplifier arrays in two adjacent memory blocks BLK1, BLK2. This variation requires power source GEN2 to supply twice as much current as before; that requirement can be met by doubling the size of the PMOS transistors PTrA1 to PTrAm.

As a fourth embodiment of the invention, a DRAM macro that solves the problem of the size of the column drivers will be described next. The general configuration of this DRAM macro is similar to that in FIG. 9, with n memory blocks BLKB1 to BLKBn. As in FIG. 10, the sense-amplifier outputs are selectively coupled to thirty-two pairs of data bus lines through transistors NTr516 to NTr771 controlled by four column lines CL1, CL2, CL3, CL4.

Figure 25:
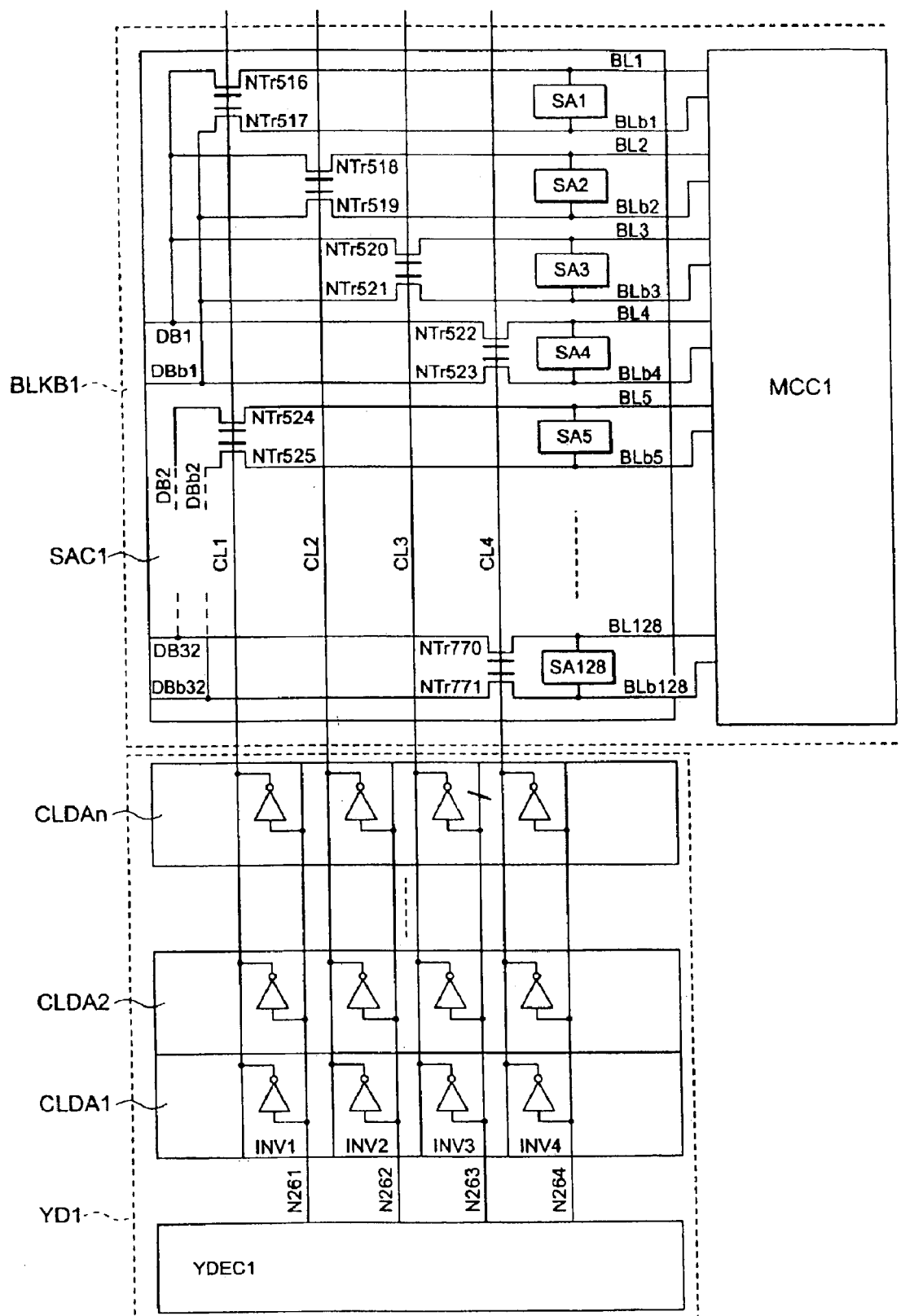
FIG. 25 is a circuit diagram illustrating unit column line drivers in a fourth embodiment of the invention.

FIG. 25 shows the internal structure of a y-decoder block, e.g., in y-decoder block YD1, in the fourth embodiment. As illustrated, n unit column line drivers CLDA1 to CLDAn are coupled in parallel between the output nodes N261 to N264 of y-decoder YDEC1 and the column lines CL1 to CL4. Each unit column line driver comprises four inverters INV1, INV2, INV3, INV4 that drive respective column lines by inverting the logic levels of the y-decoder output nodes.

Figure 26:
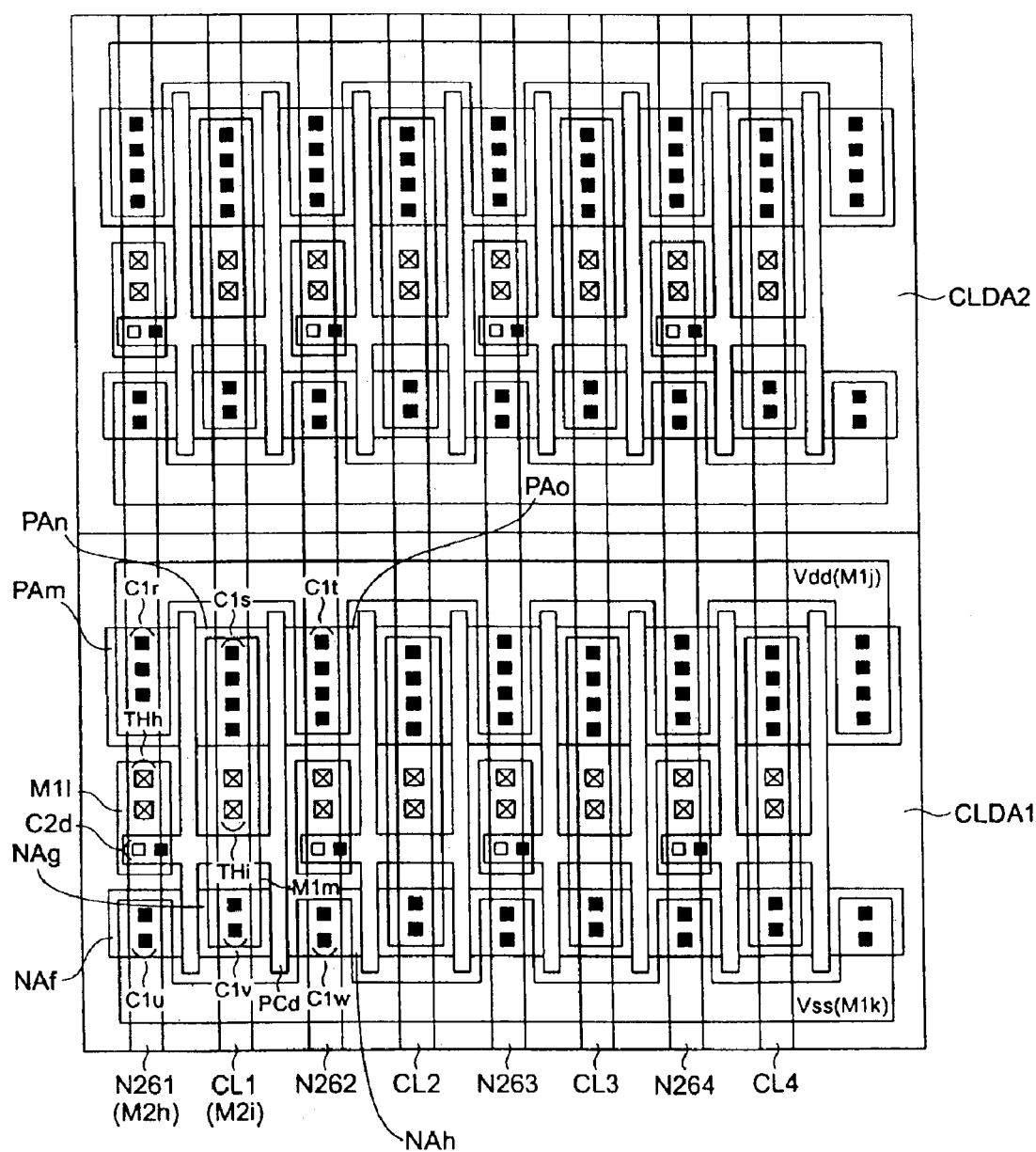
FIG. 26 is a plan view of the layout of two adjacent unit column line drivers in FIG. 25.

FIG. 26 shows the layout of two adjacent unit column line drivers CLDA1 and CLDA2. The layout is similar to that of the unit main word line drivers MWDA1 and MWDA2 shown in the second embodiment, so only a brief description will be given. The first inverter in unit column line driver CLDA1 comprises p$^+$-type regions PAm, PAn, PAo forming the source and drain of a PMOS transistor, n$^+$-type regions NAf, NAg, NAh forming the source and drain of an NMOS transistor, and a polycide gate PCd shared by both of these transistors. The first metal interconnection layer includes a Vdd electrode (M1*j*), a Vss electrode (M1*k*), gate electrodes (e.g., M1*l*), and drain electrodes (e.g., M1*m*). The second metal interconnection layer includes the y-decoder output signal lines or nodes N261 (M2*h*) to N264 and the column lines CL1 (M2*i*) to CL4. The first metal interconnection layer is coupled to the transistor source and drain regions by contacts C1*r*, C1*s*, C1*t*, C1*u*, C1*v*, C1*w*, and to the polycide gates by contacts C2*d*. The first and second metal interconnection layers are interconnected via through-holes THh, THi.

Each unit column line driver has a driving capability suitable for one sense amplifier array, as determined from the gate capacitance of the transistors NTr516 to NTr771 shown in FIG. 25, and the parasitic resistance and capacitance of the column lines CL1 to CL4. The n unit column line drivers CLDA1 to CLDAn thus provide sufficient driving capability for n sense amplifier arrays in n memory blocks, without wasting space or consuming unnecessary current by providing more than the necessary amount of driving capability.

The fourth embodiment lends itself to automated design methods, since it is only necessary to place n identical unit column drivers side by side. The design of one unit column driver can be stored as a module in a database or library and copied the necessary number of times.

Figure 27:
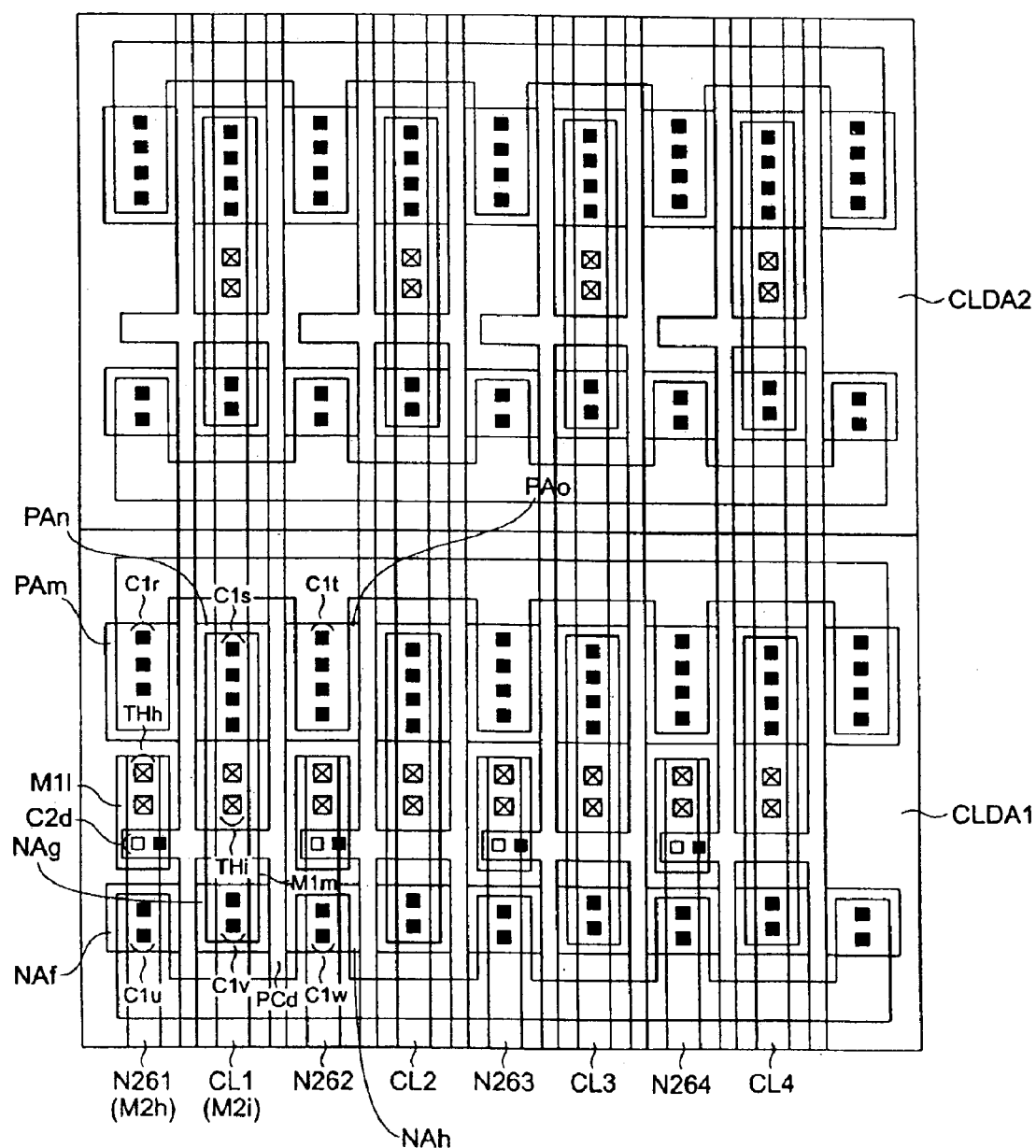
FIG. 27 is a plan view of an alternate layout of two adjacent unit column line drivers in FIG. 25.

Referring to FIG. 27, in a variation of the fourth embodiment, the gates of corresponding transistors in the different unit column line drivers are interconnected directly by extensions of the gate polycide material. For example, gate PCc extends from unit column line driver CLDA1 into unit column line driver CLDA2, forming a polycide interconnecting line. Gate electrodes such as M1*l* are then necessary only in the first unit column line driver CLDA1, and the y-decoder output lines N261 etc. only have to extend as far as this unit column line driver CLDA1.

The invention has been described in relation to column-line drivers, main word line drivers, PMOS transistors in sense-amplifier power sources, and NMOS capacitors in a power source for generating a boosted word-line voltage, but the inventive concept can also be applied to such peripheral circuits as the circuits that generate the sense latch gate signals SLNG and SLPGb, the bit line equalizing circuits that equalize the bit-line potentials to ½ Vdd, and other circuits that face differing amounts of load resistance and capacitance, depending on the memory capacity of the DRAM macro.

The invention is not limited to DRAM macros, but can be practiced in other types of memory macros.

Those skilled in the art will recognize that further variations are possible within the scope claimed below.

What is claimed is:

1. A memory macro having a word line and a first selectable number of memory blocks coupled to said word line, the memory blocks including respective memory cell arrays and associated circuits, the memory macro comprising:

a decoder having an output node; and a second selectable number of unit word line drivers coupled in parallel to said word line and coupled in parallel to said output node, driving said word line according to a logic level of said output node, the second selectable number of unit word line drivers being equal to the first selectable number of memory blocks.

2. The memory macro of claim 1, further comprising a metal line electrically interconnecting said second selectable number of unit word line drivers.

3. The memory macro of claim 1, wherein said unit word line drivers have transistors with gates made of a conductive gate material, further comprising:

an interconnecting line made of said conductive gate material, interconnecting said second selectable number of unit word line drivers.

4. The memory macro of claim 3, wherein said second selectable number of unit word line drivers are interconnected by extensions of said gates.

5. A memory macro having a column line and a first selectable number of memory blocks coupled to said column line, the memory blocks including respective memory cell arrays and associated sense amplifier arrays, the sense amplifier arrays including sense amplifiers selected by said column line, the memory macro comprising:

a decoder having an output node; and a second selectable number of unit column line drivers coupled in parallel to said column line and coupled in parallel to said output node, driving said column line according to a logic level of said output node, the second selectable number of unit column line drivers being equal to the first selectable number of memory blocks.

6. The memory macro of claim 5, further comprising a metal line electrically interconnecting said second selectable number of unit column line drivers.

7. The memory macro of claim 5, wherein said unit column line drivers have transistors with gates made of a conductive gate material, further comprising:

an interconnecting line made of said conductive gate material, electrically interconnecting said second selectable number of unit word line drivers.

8. The memory macro of claim 7, wherein said second selectable number of unit column line drivers are interconnected by extensions of said gates.

9. The memory macro of claim 1, wherein each of said second selectable number of unit word line drivers is sized to provide driving capability for one memory block.

10. The memory macro of claim 5, wherein each of said second selectable number of unit column line drivers is sized to provide driving capabilities for one memory block.

* * * * *